(12) United States Patent
Kishimoto et al.

(10) Patent No.: US 11,094,763 B2
(45) Date of Patent: *Aug. 17, 2021

(54) ORGANIC EL DEVICE WITH ALTERNATELY LINED SOURCE DRAIN ELECTRODES

(71) Applicant: SAKAI DISPLAY PRODUCTS CORPORATION, Sakai (JP)

(72) Inventors: Katsuhiko Kishimoto, Sakai (JP); Yukiya Nishioka, Sakai (JP)

(73) Assignee: SAKAI DISPLAY PRODUCTS CORPORATION, Sakai (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/625,670

(22) PCT Filed: Mar. 28, 2018

(86) PCT No.: PCT/JP2018/012910
§ 371 (c)(1),
(2) Date: Apr. 15, 2020

(87) PCT Pub. No.: WO2019/186809
PCT Pub. Date: Oct. 3, 2019

(65) Prior Publication Data
US 2020/0243630 A1    Jul. 30, 2020

(51) Int. Cl.
*H01L 27/32*    (2006.01)
*G09G 3/3225*   (2016.01)

(52) U.S. Cl.
CPC ....... *H01L 27/3258* (2013.01); *G09G 3/3225* (2013.01)

(58) Field of Classification Search
CPC .......................... H01L 27/3258; G09G 3/3225
See application file for complete search history.

(56) References Cited

U.S. PATENT DOCUMENTS

2004/0173795 A1* 9/2004 Moon ............... H01L 29/66765
257/59
2007/0235777 A1   10/2007 Nagata
(Continued)

FOREIGN PATENT DOCUMENTS

JP   H02-275672 A    11/1990
JP   2007-281155 A   10/2007
(Continued)

OTHER PUBLICATIONS

International Search Report for International application No. PCT/JP2018/012910.

*Primary Examiner* — Lex H Malsawma
(74) *Attorney, Agent, or Firm* — ScienBiziP, P.C.

(57) ABSTRACT

This organic-EL display apparatus comprises: a substrate with a drive circuit comprising a thin-film transistor (TFT), a planarizing layer to cover the drive circuit, and an organic light-emitting element formed upon the surface of the planarizing layer facing the opposite direction from the drive circuit. The surface of the planarizing layer has an arithmetic average roughness of 50 nm or less. The TFT comprises a drain electrode, a source electrode, and a semiconductor layer that includes regions to be a channel of TFT and partially overlaps with the source and drain electrodes. Respective parts of a first conductor layer forming the drain electrode and a second conductor layer forming the source electrode are arranged in an alternating manner along a prescribed direction, and the region to be the channel is sandwiched between the part of the first conductor layer and the part of the second conductor layer.

9 Claims, 13 Drawing Sheets

(56) References Cited

U.S. PATENT DOCUMENTS

| | | | |
|---|---|---|---|
| 2008/0197348 A1 | 8/2008 | Matsubara et al. | |
| 2009/0075438 A1* | 3/2009 | Jo | H01L 27/3258 |
| | | | 438/155 |
| 2010/0051952 A1* | 3/2010 | Kim | H01L 27/1288 |
| | | | 257/59 |
| 2011/0001736 A1* | 1/2011 | Tanaka | H01L 27/124 |
| | | | 345/204 |
| 2011/0204367 A1* | 8/2011 | Nakatani | H01L 27/3274 |
| | | | 257/59 |
| 2012/0097959 A1 | 4/2012 | Matsubara et al. | |
| 2012/0294102 A1 | 11/2012 | Ishizu | |
| 2013/0062608 A1 | 3/2013 | Hirai | |
| 2013/0168648 A1* | 7/2013 | Jeong | H01L 27/3246 |
| | | | 257/40 |
| 2014/0326995 A1 | 11/2014 | Ishizu | |
| 2016/0104734 A1 | 4/2016 | Hirose et al. | |
| 2017/0192271 A1* | 7/2017 | Park | G09G 3/3677 |
| 2018/0040640 A1 | 2/2018 | Takahashi et al. | |
| 2018/0144950 A1* | 5/2018 | Jeong | H01L 21/0272 |
| 2019/0355760 A1 | 11/2019 | Takahashi et al. | |
| 2020/0388661 A1* | 12/2020 | Kishimoto | H01L 27/3262 |

FOREIGN PATENT DOCUMENTS

| | | |
|---|---|---|
| JP | 2008-235861 A | 10/2008 |
| JP | 2010-129881 A | 6/2010 |
| JP | 2013-008437 A | 1/2013 |
| JP | 2013-062307 A | 4/2013 |
| JP | 2016-153888 A | 8/2016 |
| JP | 2016-197704 A | 11/2016 |
| JP | 2017-011173 A | 1/2017 |
| JP | 2018-025777 A | 2/2018 |

* cited by examiner

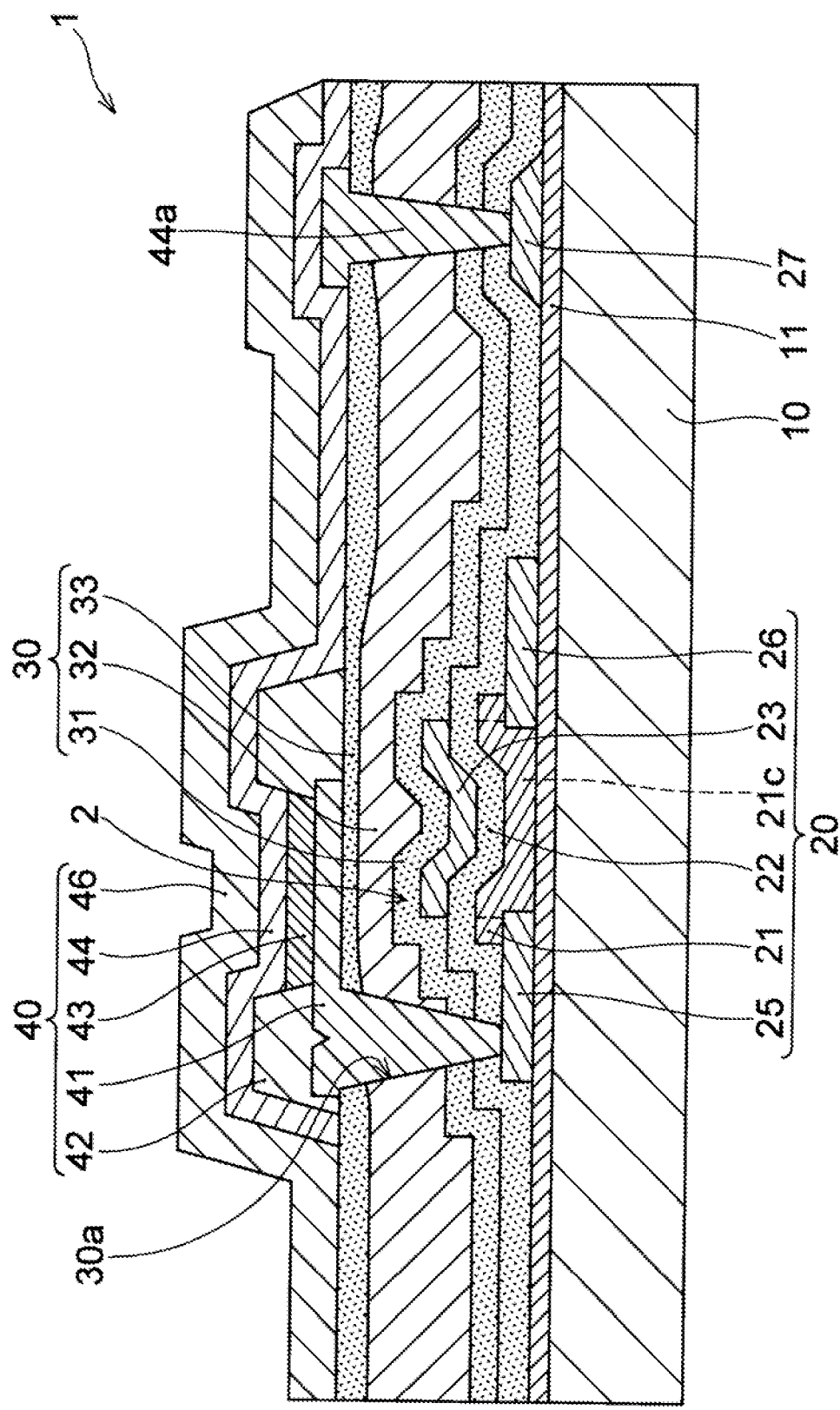

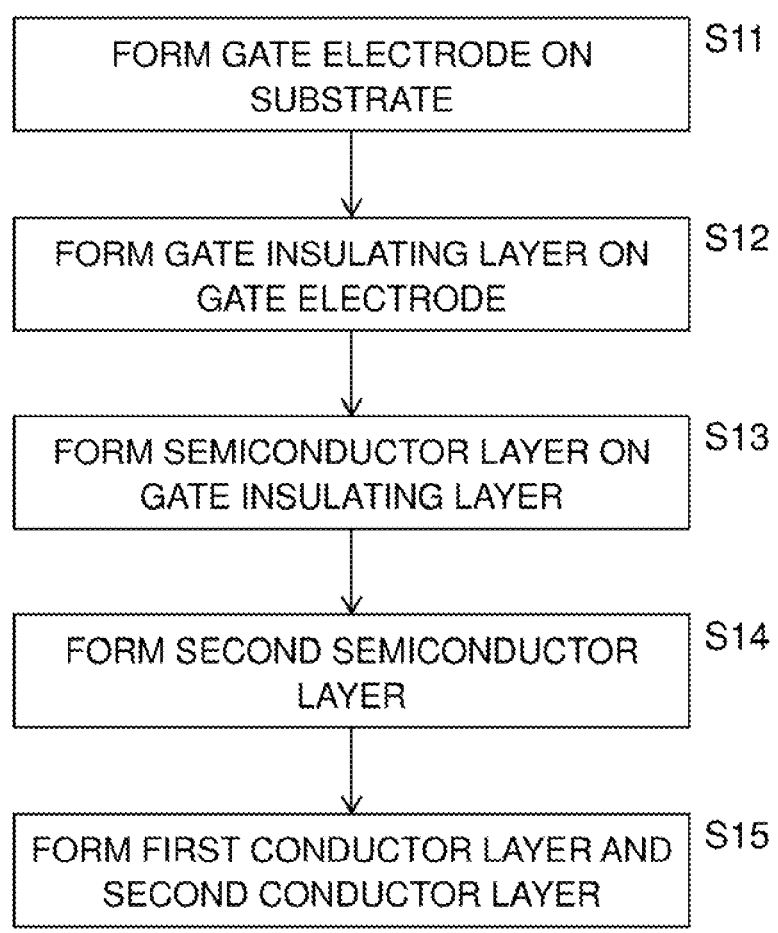

ORGANIC EL DEVICE WITH ALTERNATELY LINED SOURCE DRAIN ELECTRODES

TECHNICAL FIELD

The present invention relates to an organic-EL display apparatus and a method of manufacturing an organic-EL display apparatus.

BACKGROUND ART

An organic-EL display apparatus, application of which organic-EL display apparatus to a television is in progress in recent years, comprises an organic light-emitting element being formed for each pixel, and a drive circuit to cause the organic light-emitting element to emit light with a desired current. In an active matrix-type organic-EL display apparatus, a thin-film transistor making up the drive circuit is formed on a surface of a glass substrate for each pixel to be provided in a matrix, and an organic light-emitting element is formed on an insulating layer covering the thin-film transistor. Patent document 1 discloses forming a thin-film transistor that has a multilayer structure in order to reduce the occupied area of the thin-film transistor relative to the pixel in such an active matrix-type display.

PRIOR ART DOCUMENT

Patent Document

Patent Document 1: JP 2017-011173 A

SUMMARY OF THE INVENTION

Problem to be Solved by the Invention

In an organic-EL display apparatus, an organic light-emitting element is a current drive-type light-emitting element, so that the current supply capability (the drive capability) being higher than that in a liquid crystal display apparatus is required for a drive circuit for the organic light-emitting element. While the drive capability can be enhanced by making a thin-film transistor to have a deposition structure as in Patent document 1, the manufacturing cost inevitably increases. However, for further popularization of an organic-EL display panel into a large-sized television, a further improvement in the drive capability of the drive circuit and a substantial reduction in manufacturing cost are desired. Moreover, in the organic-EL display panel, when luminance non-uniformity or color non-uniformity (below, "luminance non-uniformity and/or color non-uniformity" also collectively called "display non-uniformity") occurs, the product value of the organic-EL display panel deteriorates. Such a display non-uniformity being likely to be conspicuous in a larger screen could prevent the popularization of the organic-EL display panel. While a compensation circuit for the display non-uniformity is being provided, or a correction unit is provided to correct a drive current of the organic light-emitting element after observing the initial display state, taking such measures also causes an increase in size or cost.

Thus, an object of the present invention is to provide an organic-EL display apparatus making it possible to enhance the capability of a drive circuit with a structure also allowing cost reduction and, even more, having a small display non-uniformity, and to provide a method of manufacturing an organic-EL display apparatus allowing to suitably manufacture the organic-EL display apparatus having a drive circuit being excellent in drive capability and having a small display non-uniformity as such.

Means to Solve the Problem

An organic-EL display apparatus according to first embodiment of the present invention comprises: a substrate having a surface with a drive circuit formed on the surface, the drive circuit comprising a thin-film transistor; a planarizing layer to planarize the surface of the substrate by covering the drive circuit; and an organic light-emitting element being formed on a surface of the planarizing layer facing to an opposite orientation from the drive circuit, and electrically connected to the drive circuit, wherein the surface of the planarizing layer has an arithmetic average roughness of 50 nm or less; the thin-film transistor comprises a gate electrode, a drain electrode, a source electrode, and a semiconductor layer comprising a region to be a channel of the thin-film transistor and partially overlapping with the drain electrode and the source electrode; a part of a first conductor layer making up the drain electrode and a part of a second conductor layer making up the source electrode are alternately lined up along a given direction; and the region to be a channel is sandwiched between the part of the first conductor layer and the part of the second conductor layer.

A method of manufacturing an organic-EL display apparatus according to second embodiment of the present invention comprises: forming a drive circuit on a substrate, the drive circuit comprising a thin-film transistor; forming, on a surface of the drive circuit, a first inorganic insulating layer, an organic insulating layer, and a second inorganic insulating layer; polishing a surface of the second inorganic insulating layer; forming a contact hole in the second inorganic insulating layer, the organic insulating layer, and the first inorganic insulating layer, so as to reach the thin-film transistor; embedding a metal at the interior of the contact hole and forming a first electrode at a given region; forming an organic light-emitting layer on the first electrode; and forming a second electrode on the organic light-emitting layer, wherein the thin-film transistor is formed so as to have a deposition structure comprising a gate electrode, a gate insulating layer, a semiconductor layer comprising a region to be a channel, a first conductor layer making up a drain electrode, and a second conductor layer making up a source electrode; the first conductor layer and the second conductor layer are formed such that a part of the first conductor layer and a part of the second conductor layer are alternately lined up along a given direction; and the region to be a channel is sandwiched between the part of the first conductor layer and the part of the second conductor layer.

Effects of the Invention

The first embodiment of the present invention makes it possible to enhance the capability of a drive circuit with a structure also allowing realization of cost reduction and, even more, to reduce display non-uniformity in an organic-EL display apparatus. Moreover, the second embodiment of the present invention makes it possible to suitably manufacture an organic-EL display apparatus having a drive circuit being excellent in drive capability and having a small display non-uniformity as such.

BRIEF DESCRIPTION OF THE DRAWINGS

FIG. 2B schematically shows a cross sectional view of another example of the thin-film transistor of the organic-EL display apparatus according to one embodiment of the present invention.

FIG. 5B shows a flowchart on a process of forming the drive circuit in FIG. 5A.

EMBODIMENT FOR CARRYING OUT THE INVENTION

Figure 1:
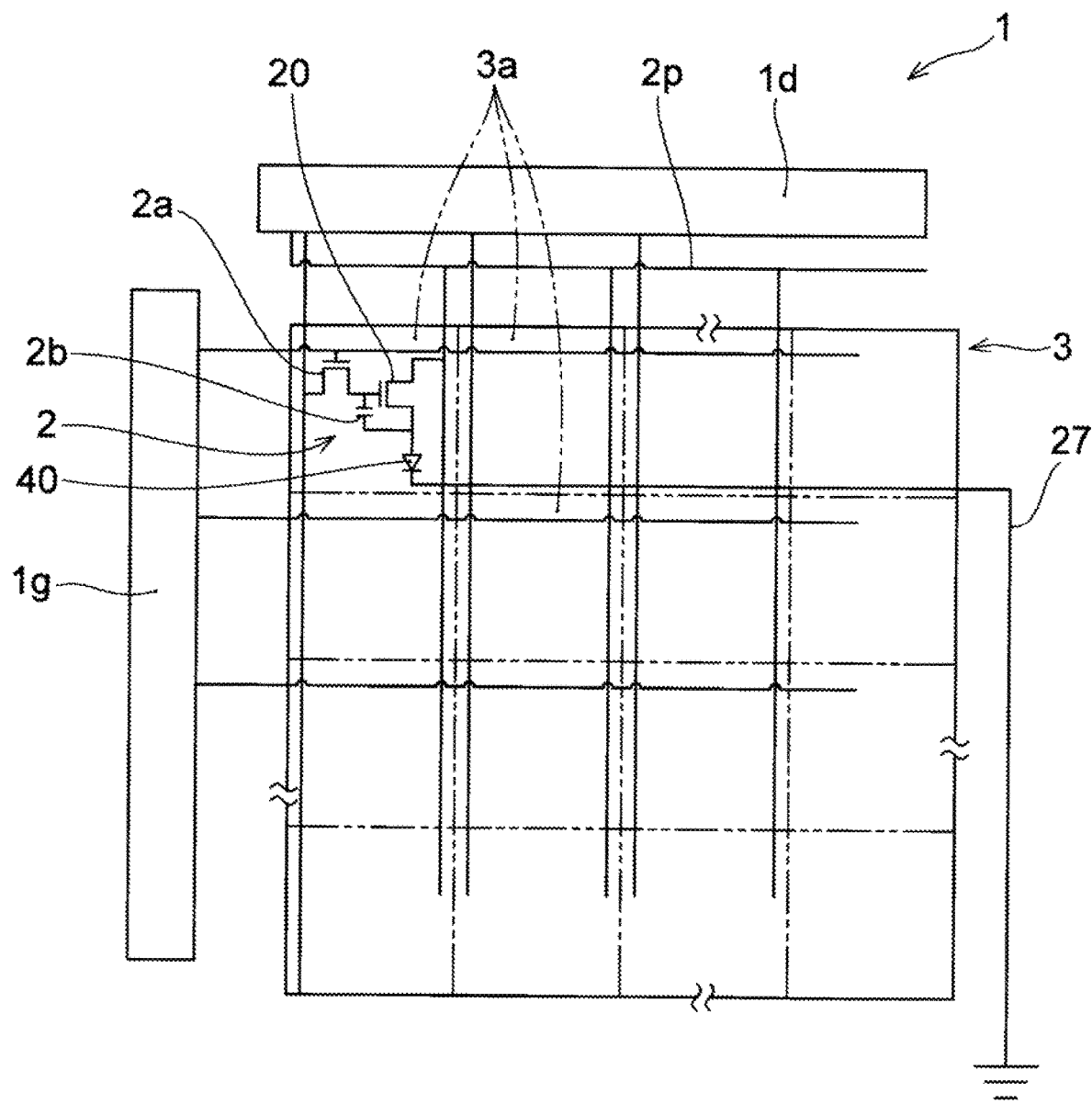
FIG. 1 schematically shows one example of a drive circuit of an organic-EL display apparatus according to one embodiment of the present invention.

The present inventors have carried out intensive studies to enhance the drive capability of a drive circuit. Then, the present inventors have found that forming a drain electrode and a source electrode of a thin-film transistor making up the drive circuit such that a part of the drain electrode and a part of the source electrode are lined up along a given direction makes it possible to substantially enhance the drive capability and, even more, to form the drive circuit within a region for one pixel of an organic-EL display apparatus. In other words, forming the drain electrode and the source electrode in this way makes it possible to increase a length (a channel width (W)) of a portion at which both of the electrodes face each other, without increasing an interval (a channel length (L)) between the drain electrode and the source electrode. Therefore, the ratio (W/L) of the channel width and the channel length can be increased substantially and, even more, efficiently in a given compartment and, as a result, a drive circuit having a substantially enhanced drive capability can be laid out in one pixel.

Moreover, the present inventors have found that using such a structure for the thin-film transistor makes it possible to form a semiconductor layer to be a channel of the thin-film transistor making up the drive circuit of the organic-EL display apparatus using not polysilicon (in particular, low temperature polysilicon: LTPS) but amorphous silicon. In other words, the LTPS being excellent in terms of carrier mobility has been used conventionally for a semiconductor layer of such a thin-film transistor. However, the present inventors have found that applying the configuration of each of the electrodes described previously enables even the semiconductor layer made of to amorphous silicon to function adequately in the drive circuit of the organic-EL display apparatus.

LTPS is obtained by forming a semiconductor layer of amorphous silicon and, thereafter, carrying out annealing for the amorphous silicon by irradiating an excimer laser, thereby poly-crystallizing the amorphous silicon. This complicates the manufacturing process and the annealing process prevents a reduction in manufacturing cost of the organic-EL display panel. Moreover, facilities required for irradiating the excimer laser are extremely expensive and, even more, the realization of facilities that can be applied to a mother substrate being in excess of the tenth generation as already introduced in a manufacturing line of a liquid crystal display apparatus is not foreseen. Furthermore, irradiating the excimer laser uniformly on the entire surface of the substrate on which the drive circuit is formed is extremely difficult, so that variations in carrier mobility occur easily and substantially among each of a plurality of LTPSs, each of which is poly-crystallized in each given compartment on the substrate, possibly causing, as a result, variations in, for example, gate threshold voltage to occur easily among each of the thin-film transistors. Irradiating the excimer laser uniformly on the mother substrate will be increasingly difficult with upsizing of the mother substrate. The present inventors have found that using the previously-described structure of the thin-film transistor makes it possible to form the semiconductor layer of the thin-film transistor in the drive circuit of an organic-EL display panel with amorphous silicon not requiring annealing.

The present inventors have further found that unevenness to of the surface of the drive circuit being formed on the surface of the substrate produces variations in layer thickness of an organic layer in an organic light-emitting element, possibly producing, as a result, luminance non-uniformity or color non-uniformity. Describing in further detail, an insulating layer is provided between the drive circuit and the organic light-emitting element as described previously, and the insulating layer makes it possible to achieve planarization of the base for the organic light-emitting element as well as blocking of moisture and electrical isolation of the drive circuit and the organic light-emitting element. However, the present inventors have found that the planarization is not necessarily sufficient from a viewpoint that an excellent display quality can be obtained. In a case that the surface of such an insulating layer (a planarizing layer) is not sufficiently planar, a variation in layer thickness of an organic layer formed on the surface of the insulating layer via an electrode causes luminance non-uniformity and/or deviation of a direction in which an outgoing light has its peak intensity from the normal direction of the display surface, thereby causing the display non-uniformity. The present inventors have found that occurrence of the display non-uniformity can be suppressed by achieving further planarization of the surface of the planarizing layer to be the base for the organic light-emitting element. Moreover, achieving further planarization of the surface of the planarizing layer as such makes it possible to suppress, even in a case that the thin-film transistor having the structure as described previously is formed at an underlayer of a light-emitting region of the organic light-emitting element, the display non-uniformity that can be produced due to the unevenness on the to surface of the planarizing layer.

Below, an organic-EL display apparatus and a method of manufacturing an organic-EL display apparatus according to embodiments of the present invention are described with reference to the drawings. Material and shape of individual constituting elements, and relative positional relationship thereof in the embodiments to be described below are merely exemplary. The organic-EL display apparatus and method of manufacturing an organic-EL display apparatus according to the present invention are construed to be not limited thereto.

(Organic-EL Display Apparatus)

In FIG. 1, one example of a configuration of a drive circuit 2 of an organic-EL display apparatus 1 according to first embodiment is shown together with an organic-EL display panel 3, a data line driver 1d, and a scanning line driver 1g, each of which is shown schematically. The organic-EL display panel 3 comprises a plurality of pixels 3a being arranged in a matrix, and an organic light-emitting element 40 and the drive circuit 2 are provided in each of the pixels 3a. In the example in FIG. 1, the drive circuit 2 comprises a driving TFT 20 to switch the conduction state of the organic light-emitting element 40, a switching TFT 2a to switch on/off of the driving TFT 20, and a storage capacitance 2b to hold the gate-source voltage of the driving TFT 20. The drain, the source, and the gate of the driving TFT 20 are connected to a power line 2p, an anode of the organic light-emitting element 40, and the source of the switching TFT 2a, respectively, while a cathode of the organic light-emitting element 40 is connected to the ground via a cathode wiring 27.

Figure 2A:
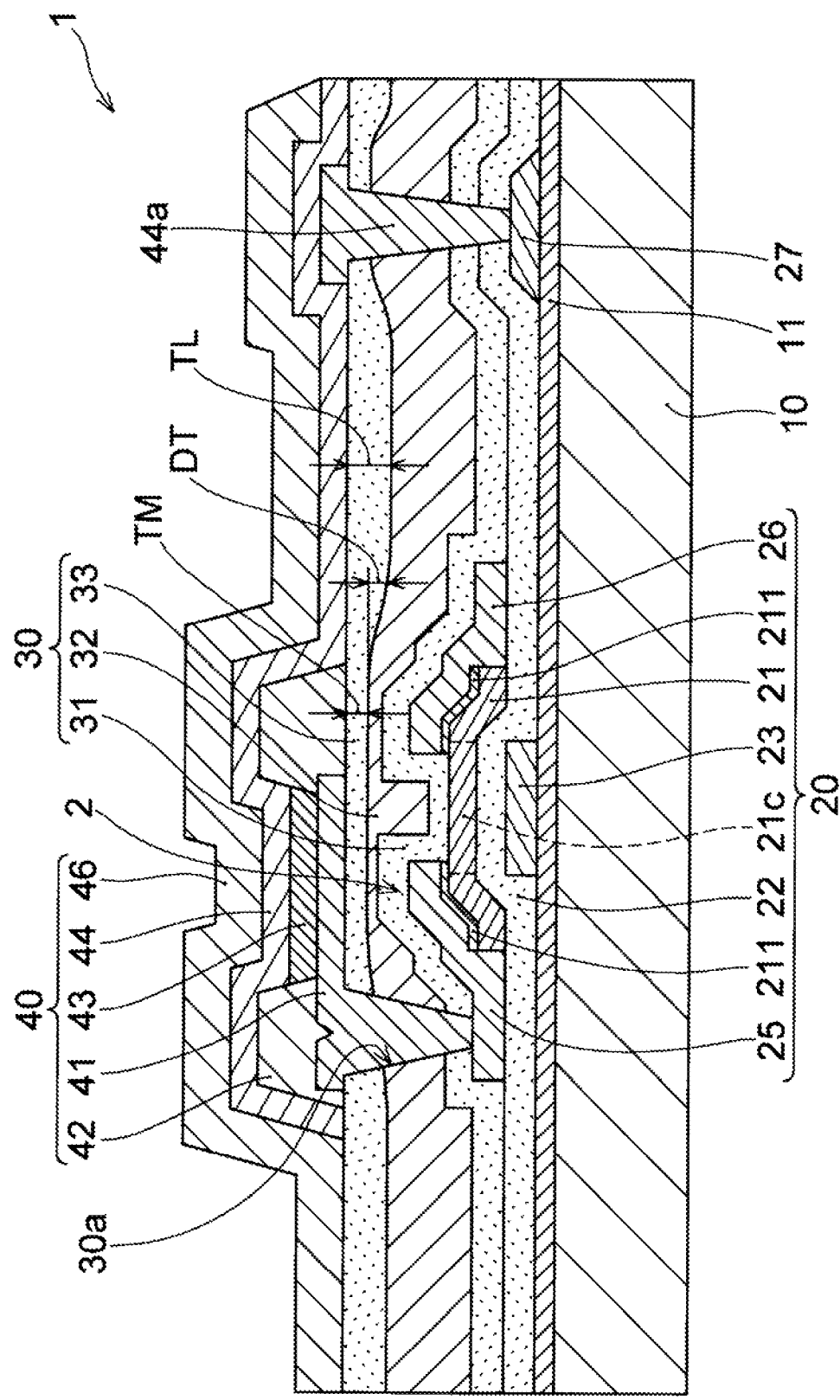
FIG. 2A schematically shows a cross sectional view of one example of an organic light-emitting element and a thin-film transistor of the organic-EL display apparatus according to one embodiment of the present invention.
Figure 2C:
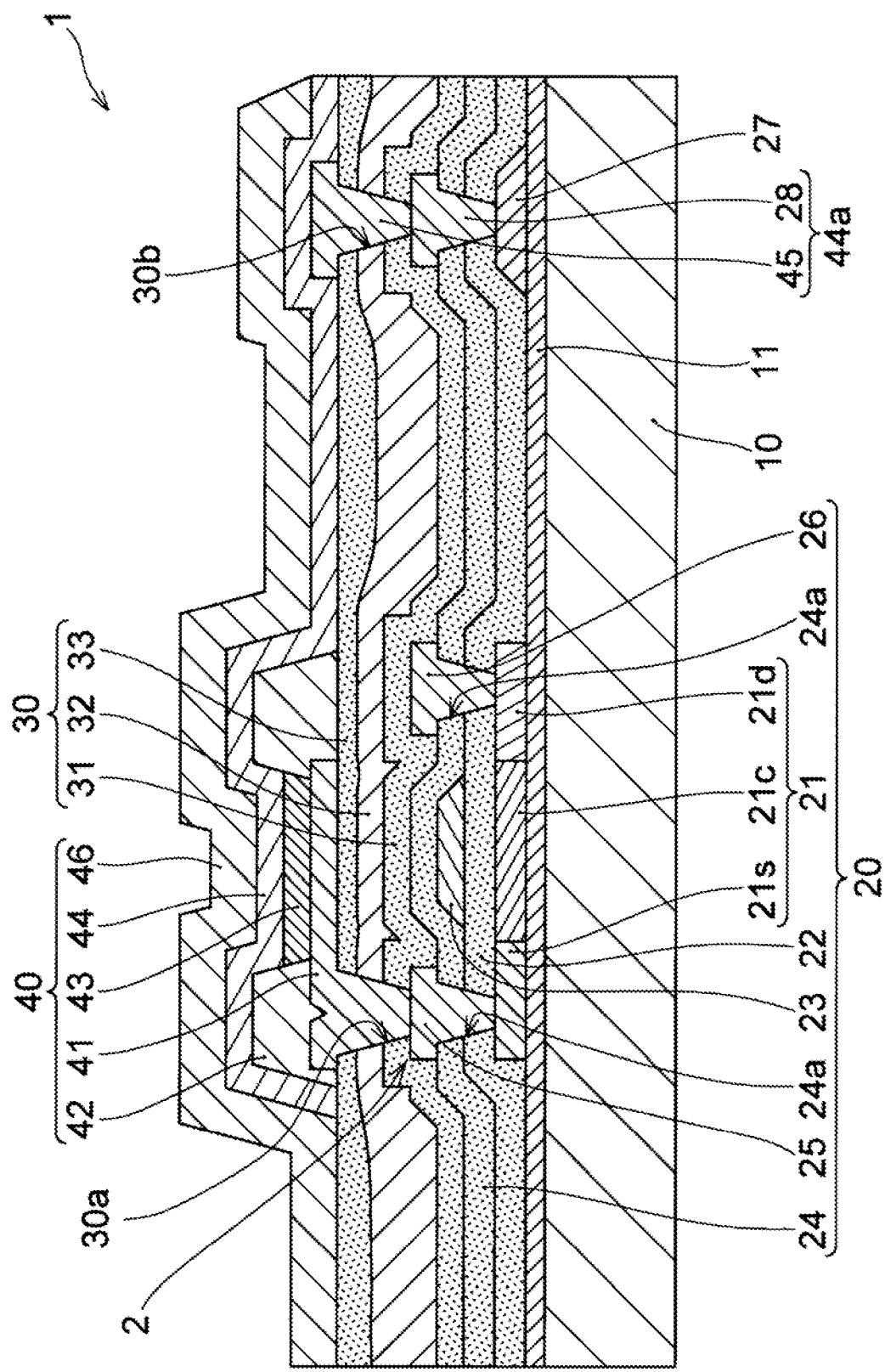
FIG. 2C schematically shows a cross sectional view of yet another example of the thin-film transistor of the organic-EL display apparatus according to one embodiment of the present invention.

A gate signal is transmitted to the individual switching TFT 2a from the scanning line driver 1g and also a data signal of a display image is applied to the gate of each driving TFT 20 via the individual switching TFT 2a from the data line driver 1d. A current based on the voltage of the data signal flows to the organic light-emitting element 40, and the organic light-emitting element 40 emits light at a given luminance during one frame period thanks to the behavior of the storage capacitance 2b. Below, the organic-EL display apparatus 1 according to the present embodiment is explained with reference to FIGS. 2A to 2C showing cross sections of the organic-EL display panel 3 and including one of the pixels 3a. In the explanations below, the driving TFT 20 is merely called "the thin-film transistor 20 (TFT 20)". Moreover, the "pixel" being referred to in the explanations and each of the drawings in the above and in the following is a minimum constituting element (unit element) of a display screen, to be exact, "a sub-pixel", but is also called a "pixel" for brevity of explanations. Furthermore, the "surface" in the explanations in the following means a surface facing to an opposite orientation from a substrate 10 (see FIG. 2A) in each constituting element constituting the organic-EL display apparatus 1 other than the substrate 10 in a case that no distinction thereof is particularly recited. Moreover, the "surface" with respect to the substrate 10 means a surface facing to the organic light-emitting element 40 in a case that no distinction thereof is particularly recited.

Figure 3A:
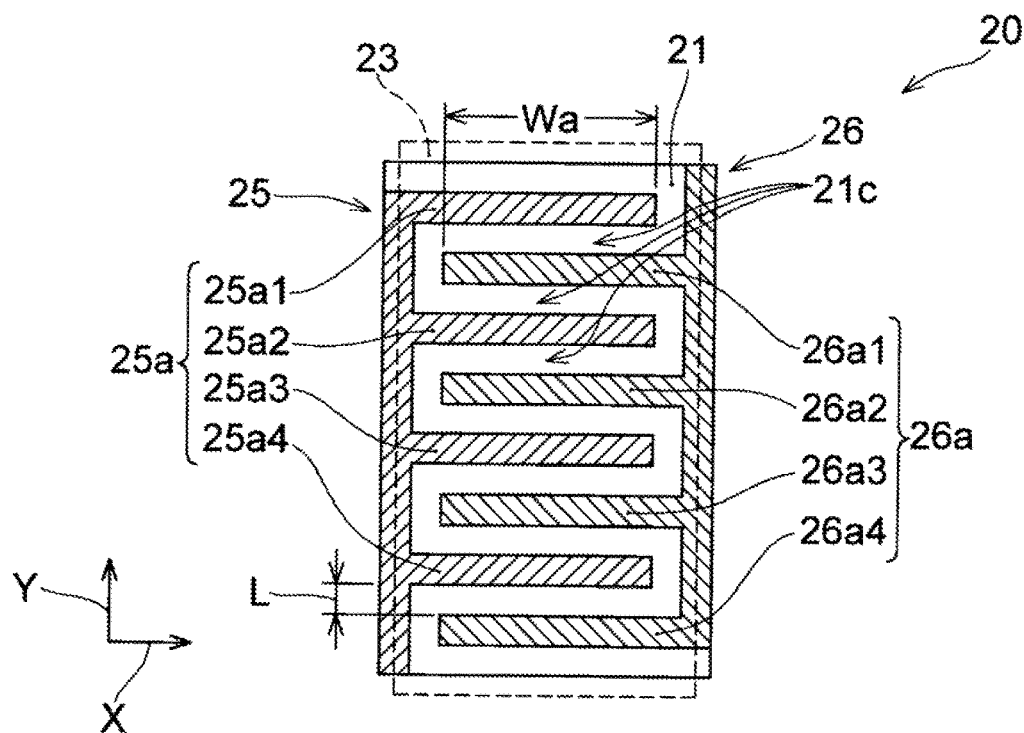
FIG. 3A shows a plan view of one example of each electrode of the thin-film transistor of the organic-EL display apparatus according to one embodiment of the present invention.
Figure 3B:
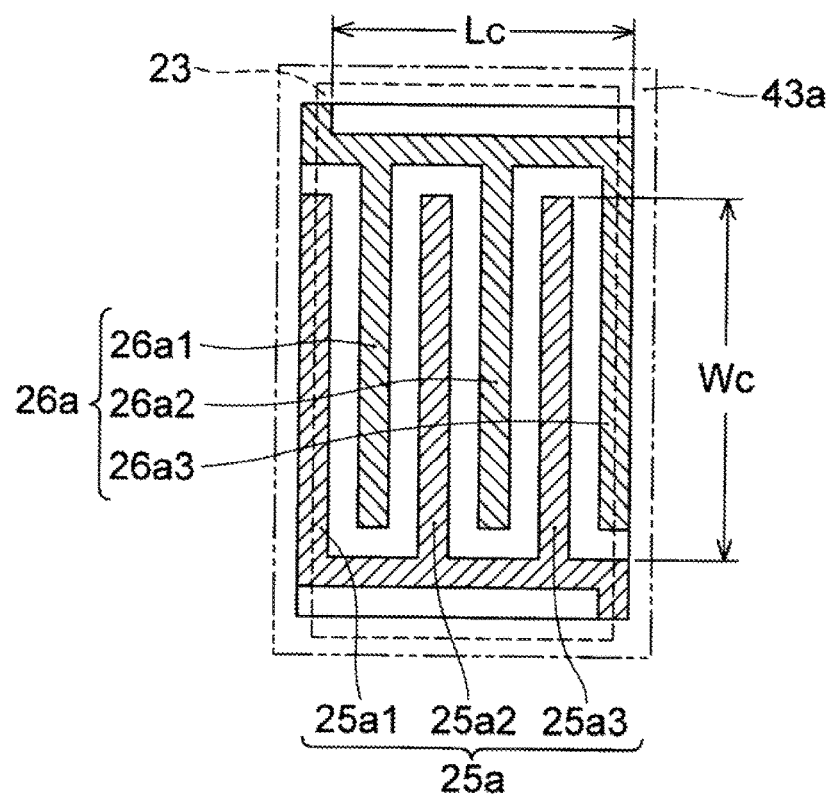
FIG. 3B shows a plan view of another example of each electrode of the thin-film transistor of the organic-EL display apparatus according to one embodiment of the present invention.
Figure 3C:
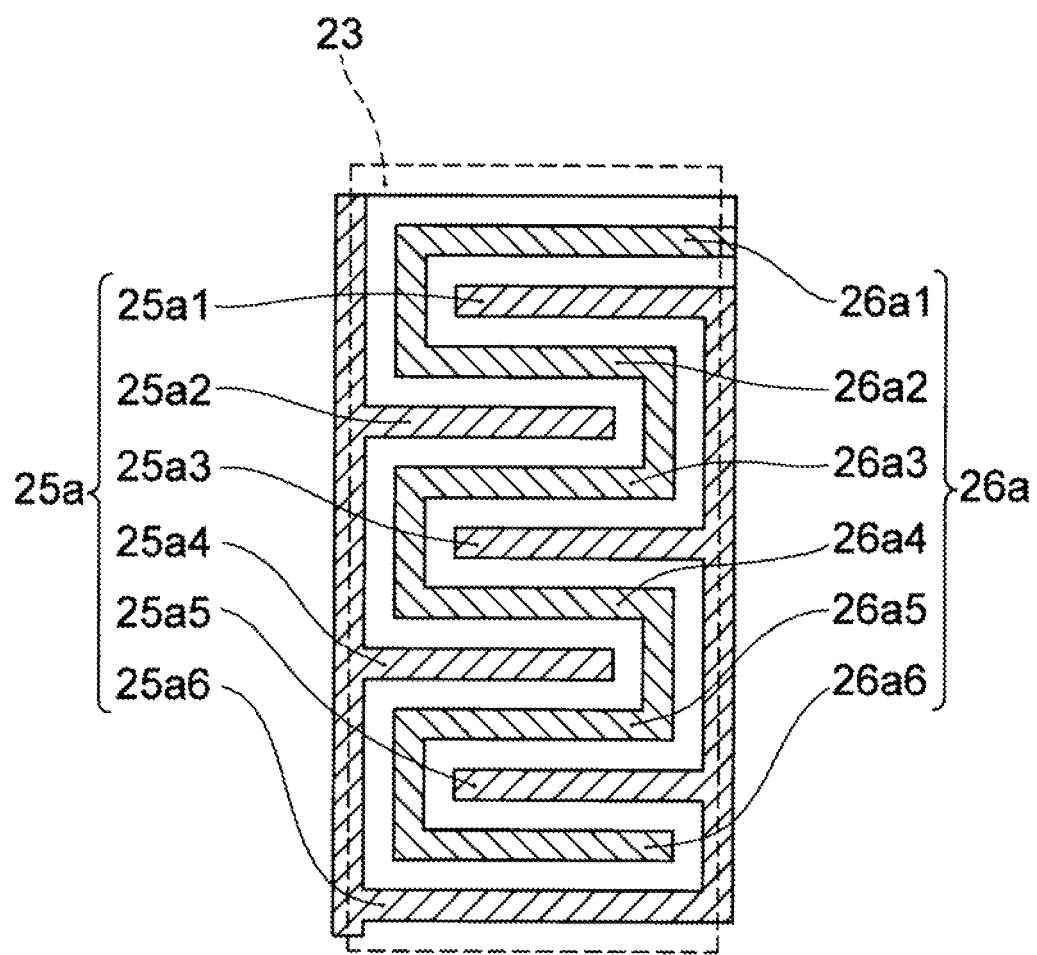
FIG. 3C shows a plan view of yet another example of each electrode of the thin-film transistor of the organic-EL display apparatus according to one embodiment of the present invention.

A structure of the TFT 20 of the drive circuit 2 of the organic-EL display apparatus 1 according to the present embodiment is explained with reference to FIGS. 2A to 2C and FIGS. 3A to 3C. FIGS. 2A to 2C shows, in an enlarged manner, a cross section of the organic-EL display panel 3, and, particularly, one example of a cross section of the TFT 20 and the organic light-emitting element 40. FIGS. 3A to 3C each show a plan view of a specific example of the TFT 20 (a drain electrode 26 and a source electrode 25 are hatched.) FIGS. 2A to 2C show, as the TFT 20, a cross section of one of a plurality of portions at which a part of the source electrode 25 and a part of the drain electrode 26 face each other (a cross section along a cutting line being along the opposing direction of both electrodes or along the Y direction in FIG. 3A, for example, is shown). Moreover, while FIGS. 2A to 2C show a gate electrode 23 and an semiconductor layer 21 as being formed only in a facing portion of the source electrode 25 and the drain electrode 26, the gate electrode 23 can be formed such that it extends over the entirety of the plurality of facing portions of the source electrode 25 and the drain electrode 26.

As shown in FIGS. 2A to 2C, the organic-EL display apparatus 1 according to the present embodiment comprises a substrate 10 having a surface on which the drive circuit 2 comprising the TFT 20 has been formed; a planarizing layer 30 to planarize the surface of the substrate 10 by covering the drive circuit 2; and the organic light-emitting element 40 being formed on a surface of the planarizing layer 30 facing to an opposite orientation from the drive circuit 2, and electrically connected to the drive circuit 2. The TFT 20 comprises the gate electrode 23, the drain electrode 26, the source electrode 25, and a semiconductor layer 21 comprising a region to be a channel 21c of the TFT 20. The semiconductor layer 21 partially overlaps with the drain electrode 26 and the source electrode 25. In the example in FIG. 2A, a second semiconductor layer 211 formed of a semiconductor having a high impurity concentration is provided between the semiconductor layer 21 and each of the drain electrode 26 and the source electrode 25. A channel is formed by applying a given voltage to the gate electrode 23 mainly at a region 21c in the semiconductor layer 21. The region 21c is a region between the drain electrode 26 and the source electrode 25, and overlaps with the gate electrode 23.

FIG. 2A shows an example of a bottom gate structure (reverse-staggered structure) in which the gate electrode 23 is arranged between the semiconductor layer 21 and the substrate 10, while FIG. 2B shows an example of a top gate structure (staggered structure). FIGS. 2A and 2B show an example in which the semiconductor layer 21 is made of amorphous silicon. Moreover, FIG. 2C is an example of the TFT 20 having the top gate structure in the same manner as the example in FIG. 2B. The structure exemplified in FIG. 2C is used mainly in a case that the region to be a channel 21c of the semiconductor layer 21 is formed of LTPS. While the drive circuit 2 of the organic-EL display apparatus 1 according to the present embodiment is preferable in a case that the semiconductor layer 21 of the TFT 20 is formed of amorphous silicon, the region to be the channel 21c of the semiconductor layer 21 can be formed of LTPS.

In the example in FIG. 2A, the gate electrode 23 is formed over the substrate 10 via a base coat layer 11, the gate insulating layer 22 and the semiconductor layer 21 are deposited so as to cover the gate electrode 23, the second semiconductor layer 211 is formed on the semiconductor layer 21, and the drain electrode 26 and the source electrode 25 are deposited on the second semiconductor layer 211. The cathode wiring 27 and a second electrode 44 of the organic light-emitting element 40 are connected via a cathode contact 44a. In the example in FIG. 2B, the drain electrode 26 and the source electrode 25 are formed on the base coat layer 11, the semiconductor layer 21 is deposited on the base coat layer 11 between the drain electrode 26 and the source electrode 25 so as to overlap with a part of the drain electrode 26 and a part of the source electrode 25, and, moreover, the gate insulating layer 22 is deposited on the semiconductor layer 21 and the gate electrode 23 is formed on the gate insulating layer 22.

In the example in FIG. 2C, the semiconductor layer 21 comprising a source 21s, the region to be a channel 21c being formed of LTPS, and a drain 21d is formed on the base coat layer 11, and a gate insulating layer 22 is deposited so as to cover the semiconductor layer 21. The gate electrode 23 is formed on the gate insulating layer 22, an interlayer insulating layer 24 is deposited so as to cover the gate electrode 23, and the source electrode 25 and the drain electrode 26 are formed on the interlayer insulating layer 24. The source electrode 25 and the drain electrode 26 are connected to the source 21s and the drain 21d, respectively, of the semiconductor layer 21 via a contact hole 24a. The cathode contact 44a is made up of a first contact 28 penetrating the gate insulating layer 22 and the interlayer insulating layer 24, and a second contact 45 penetrating the planarizing layer 30. The example shown in FIGS. 2A to 2C merely differ mutually in the structure of the TFT 20 (mainly in the vertical relationship in the lamination of constituting elements of the TFT 20). In FIGS. 2A to 2C, the same reference numerals are affixed to constituting elements having the same functions, so that repeated explanations of such constituting elements will be omitted.

The organic light-emitting element 40 being a top emission-type (TE-type) organic light-emitting diode (OLED) in the examples in FIG. 2A to 2C comprises a first electrode (for example, an anode) 41 being formed on the planarizing layer 30, an insulating bank 42 surrounding the first electrode 41, an organic light-emitting layer 43 being formed within the insulating bank 42, and a second electrode (for example, a cathode) 44 being formed over the entirety of the substrate 10, such as on the organic light-emitting layer 43. In the examples in FIGS. 2A to 2C, the source electrode 25 of the TFT 20 is connected to the first electrode 41 of the organic light-emitting element 40.

In a case that the organic light-emitting element 40 is of the TE-type as in the examples in FIGS. 2A to 2C, the TFT 20 can be formed, at the underlayer (between the first electrode 41 and the substrate 10) of a light-emitting region of the organic light-emitting element 40, or, in other words, a region at which the organic light-emitting layer 43 is formed, so as to overlap with a part of or the entirety of the light-emitting region. In that case, the TFT 20 allowing a large current to flow can be formed.

As shown in FIGS. 3A to 3C, the drain electrode 26 and the source electrode 25 are made up of a conductor layer made of titanium or aluminum, for example, and a part of a first conductor layer 26a making up the drain electrode 26 and a part of a second conductor layer 25a making up the source electrode 25 are alternately lined up along a given direction. In the example in FIG. 3A, the respective parts of the conductor layers are alternately lined up along the vertical direction (Y direction) in FIG. 3A. The region to be the channel 21c is a region in the semiconductor layer 21 being sandwiched between the part of the first conductor layer 26a and the part of the second conductor layer 25a. As described previously, a channel is formed in the region 21c by applying a given voltage to the gate electrode 23, and the drain electrode 26 and the source electrode 25 electrically conduct with each other.

In this way, the part of the first conductor layer 26a and the part of the second conductor layer 25a are alternately lined up along a given direction (the Y direction in FIG. 3A), therefore, it is possible to obtain a drain electrode 26 and a source electrode 25 each having a long portion at which these electrodes face each other in a region having a given size. Therefore, a channel having a large channel width (W) can be formed. On the other hand, a channel length L being the interval between the first conductor layer 26a and the second conductor layer 25a does not increase in conjunction with the part of the first conductor layer 26a and the part of the second conductor layer 25a being alternately lined up. Therefore, a limited region can be effectively utilized to form a channel having a large ratio (W/L) of the channel width (W) and the channel length (L), or, in other words, a channel through which a large current is allowed to flow. Therefore, the TFT 20 having a great drive capability, for example, can be formed in one pixel and a drive circuit having a great drive capability can be formed for each pixel.

Moreover, when the part of the first conductor layer 26a and to the part of the second conductor layer 25a are alternately lined up in this way and a channel having a large W/L ratio is formed in a region of a given size, it become possible to form the semiconductor layer 21 by not the previously-described LTPS but amorphous silicon. Describing in further detail, the electron mobility in LTPS is approximately 100 cm$^2$/Vs, while the electron mobility in amorphous silicon is approximately 0.5 cm$^2$/Vs. Therefore, in a case of using amorphous silicon, the W/L ratio simply needs to be increased to approximately 200 times the W/L ratio (approximately 2.5, for example) of a channel using LTPS being put in practical use. However, the electron mobility of the semiconductor layer actually needed for driving the organic light-emitting element of the organic-EL display apparatus is approximately 10 cm$^2$/Vs in a case of the previously-described W/L ratio currently used for the LTPS. Therefore, increasing the W/L ratio approximately 20 times the current W/L ratio, for example, makes it possible to use amorphous silicon for the semiconductor layer 21 of the TFT 20 of the drive circuit 2. Therefore, for example, forming a channel having a W/L ratio of 50 or more by lining up the part of the first conductor layer 26a and the part of the second conductor layer 25a alternately makes it possible to use amorphous silicon for the semiconductor layer 21, thereby eliminating the need for the annealing process for obtaining LTPS as described previously. In other words, the TFT 20 of the drive circuit 2 can be formed easily and inexpensively without using expensive facilities and, even more, with a method being possible to follow upsizing of the mother substrate. Moreover, the amorphous silicon has small variations in carrier mobility, therefore, it is possible to reduce the occurrence of display non-uniformity, and thereby, eliminating the need for a circuit for compensating the display non-uniformity. Thus, also in light of these aspects, it is possible to contribute to reducing the cost of the organic-EL display apparatus and improving the display quality.

In the example in FIG. 3A, each of the first conductor layer 26a and the second conductor layer 25a is formed into a comb shape in planar view. Then, comb tooth portions (first portions 26a1 to 26a4 in the example in FIG. 3A) of the first conductor layer 26a and comb tooth portions (second portions 25a1 to 25a4 in the example in FIG. 3A) of the second conductor layer 25a are formed such that the comb tooth portions of the first conductor layer 26a engage with the comb tooth portions of the second conductor layer 25a. In the bottom gate-type TFT 20 such as the example in FIG. 2A, the gate electrode 23 being shown in broken lines in FIGS. 3A to 3C is formed below the first conductor layer 26a and the second conductor layer 25a (between the gate insulating layer 22 and the substrate 10, see FIG. 4A). Moreover, in the top gate-type TFT 20 such as the example in FIG. 2B, the gate electrode 23 is formed above the first conductor layer 26a and the second conductor layer 25a (on the gate insulating layer 22, see FIG. 4B). The gate electrode 23 is formed so as to overlap with a facing portions of the first portions 26a1 to 26a4 and the second portions 25a1 to 25a4 (all of the facing portions in the example in FIG. 3A).

The gate electrode 23 is formed over the entire range of a length Wa of a portion at which the first portions 26a1 to 26a4 being a part of the first conductor layer 26a and the second portions 25a1 to 25a4 being a part of the second conductor layer 25a face each other. Therefore, a channel is formed between the second portions 25a1 to 25a4 and the first portions 26a1 to 26a4 facing each other in the Y direction in an area up to each tip of the first portions 26a1 to 26a4 and the second portions 25a1 to 25a4. Moreover, in the example in FIG. 3A, the gate electrode 23 is formed such that the gate electrode 23 overlaps with portions between the second conductor layer 25 and the first portions 26a1 to 26a4, at which the tips of the first portions 26a1 to 26a4 face the second conductor layer 25 in a direction (X direction in FIG. 3A) being orthogonal to the Y direction, and such that the gate electrode 23 overlaps with portions between the first conductor layer 26 and the second portions 25a1 to 25a4, at which the tips of the second portions 25a1 to 25a4 face the first conductor layer 26 in the X direction. Therefore, a channel is formed in the entirety of the region 21c between the first conductor layer 26a and the second conductor layer 25a so that this region 21c which is to be a channel has a zigzag shape. Therefore, a channel having a large channel width (W), namely, a channel through which a large current is allowed to flow can be formed, effectively using a limited region as exactly shown in FIG. 3A, for example.

The first portions 26a1 to 26a4 of the first conductor layer 26a and the second portions 25a1 to 25a4 of the second conductor layer 25a are alternately lined up along a given direction (the Y direction in FIG. 3A), so that the region to be a channel 21c exists in a plurality in the Y direction. Specifically, it exists in each of a region sandwiched between the second portion 25a1 and the first portion 26a1, a region sandwiched between the first portion 26a1 and the second portion 25a2, and a region sandwiched between the second portion 25a2 and the first portion 26a2, for example, in the semiconductor layer 21. In the example in FIG. 3A, the region to be a channel 21c is an integral (a continuous) region having a zigzag shape and a channel which is formed in the region to be a channel 21c preferably has the W/L ratio of 50 or more. However, in the tip portion of each of the first portions 26a1 to 26a4 and the second portions 25a1 to 25a4, the channel length varies at the corner.

Therefore, the channel width (W) to be used in calculating the W/L ratio is preferably set to be the total sum (Wa*n) of the length Wa of portions at which a part (any the first portions 26a1 to 26a4) of the first conductor layer 26a and a part (any of the second portions 25a1 to 25a4) of the second conductor layer 25a face each other, in each region to be a channel 21c existing in a plurality (for example, n) in the Y direction. Then, the ratio (W/L) of the channel width (W=Wa*n) and the interval (the channel length L) between the first conductor layer 26a and the second conductor layer 25a at the portion in which a part of the first conductor layer 26a and a part of the second conductor layer 25a face each other is preferably 50 or more. The first conductor layer 26a and the second conductor layer 25a can be provided in this way to surely obtain a preferable W/L ratio even though the channel width between the tip of each of a part of the first conductor layer 26a and a part of the second conductor layer 25a, and the second conductor layer 25a or the first conductor layer 26a is ignored. The length Wa is a length of the facing portion of the first and second conductor layers in a direction (the X direction) orthogonal to a direction (the Y direction) in which a part of the first conductor layer 26a and a part of the second conductor layer 25a are alternately lined up. Moreover, as shown with Wa*n, the total sum of lengths Wa is a sum of lengths for all of the regions to be a channel 21c existing in a plurality in the Y direction.

The greater the W/L ratio of the channel of the TFT 20 is, the more preferable it is from a viewpoint of the drive capability. However, it can also be preferable not to increase the W/L ratio more than necessary from a viewpoint of the size of the thin-film transistor 20. For example, as described previously, the electron mobility in amorphous silicon is approximately 1/200 of the electron mobility in LTPS, so that, even in a case of obtaining the same drive capability as that of the semiconductor layer made of LTPS currently used, it suffices that the W/L ratio be 200 times the W/L ratio (for example, approximately 2.5) of the channel made of LTPS. Therefore, the ratio (W/L) of the total sum (W) of lengths (Wa) of the portions at which a part of the first conductor layer 26a and a part of the second conductor layer 25a face each other in the region to be a channel 21c, and the interval L between the first conductor layer 26a and the second conductor layer 25a is preferably 50 or more and 500 or less.

Also in the example in FIG. 3B, each of the first conductor layer 26a and the second conductor layer 25a is formed so as to have a comb shape in planar view. In the example in FIG. 3B, a length We of comb tooth portions (first portions 26a1 to 26a3) of the first conductor layer 26a and comb tooth portions (second portions 25a1 to 25a3) of the second conductor layer 25a is greater than a length Lc of a connection portion connecting the comb tooth portions. Moreover, a light-emitting region 43a of the organic light-emitting element 40 (see FIG. 2A) being shown in a chain double-dashed line in FIG. 3B is to be formed in a rectangular shape. Then, a portion at which the first portions 26a1 to 26a3 being a part of the first conductor layer 26a and the second portions 25a1 to 25a3 being a part of the second conductor layer 25a face each other is formed along a long side of the rectangular shape of the light-emitting region 43a.

Forming, in such a manner as in the example in FIG. 3B, the facing portions of each of the first conductor layer 26a and the second conductor layer 25a makes it possible to increase the length Wa of facing portions to be counted in the channel width (W) in the calculation of the previously-mentioned W/L ratio. Moreover, the number of portions, between the tip of a part of the first conductor layer 26a or the tip of a part of the second conductor layer 25a and the second conductor layer 25a or the first conductor layer 26a, which are not incorporated in the calculation of the W/L ratio, can be reduced. It can be considered that the allowable current amount in the channel being easily calculatable and the actual allowable current amount can be brought closer, thus making it possible to suitably design the TFT 20. It can be considered that the example in FIG. 3B be preferable in a case that the TFT 20 is formed so as to fall in a pixel of which great majority is occupied by the light-emitting region 43a having a rectangular shape.

In FIG. 3C, yet another example of the first conductor layer 26a and the second conductor layer 25a is shown. In the example in FIG. 3C, the first conductor layer 26a is formed so as to have a zig-zag planar shape in which first portions 26a1 to 26a6 being a part of the first conductor layer 26a are connected at an alternately different end portion. Then, the second conductive layer 25a is formed in the surrounding of the first conductor layer 26a and, further, each of second portions 25a1 to 25a6 being a part of the second conductive layer 25a is inserted into a concavity of the zig-zag planar shape that the first conductor layer 26a has. Unlike the example in FIG. 3C, the second conductor layer 25a can be formed so as to have a zig-zag planar shape, while a part of the first conductor layer 26a can be inserted into a concavity of the planar-shape of the second conductor layer 25a. As exemplified in FIG. 3C, the first conductor layer 26a and the second conductor layer 25a do not necessarily have to be formed so as to have a comb tooth-shape as in the examples in FIGS. 3A and 3B. Moreover, the number of first portions of the first conductor layer 26a and the number of second portions of the second conductor layer 25a is construed to be not limited to the examples in FIGS. 3A to 3C, so that an arbitrary number of first portions and second portions can be provided. Except for the planar shape of the first and second conductor layers 26a, 25a, the TFT 20 shown in FIGS. 3B and 3C is the same as the TFT 20 shown in FIG. 3A, so that repeated explanations will be omitted.

Figure 4A:
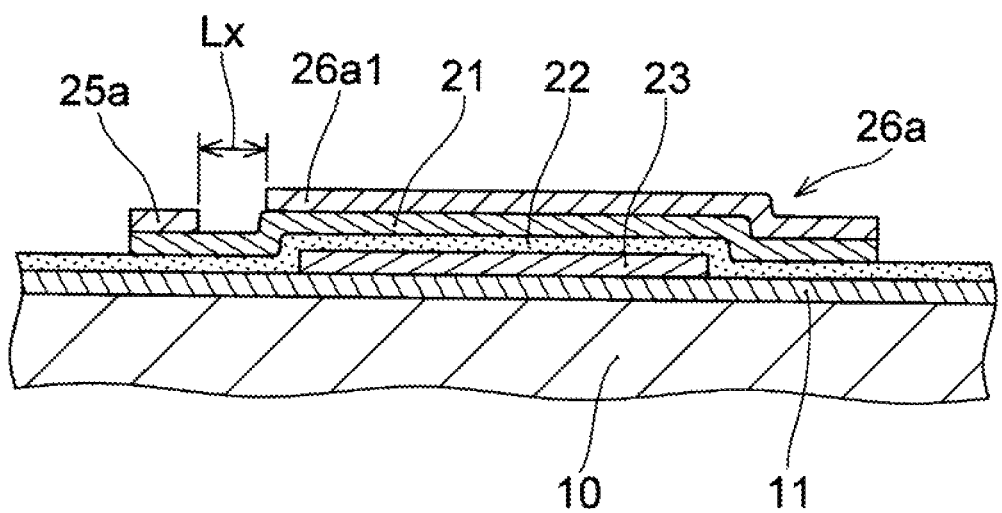
FIG. 4A shows a cross-sectional view of one example of the thin-film transistor of the organic-EL display apparatus according to one embodiment of the present invention.
Figure 4B:
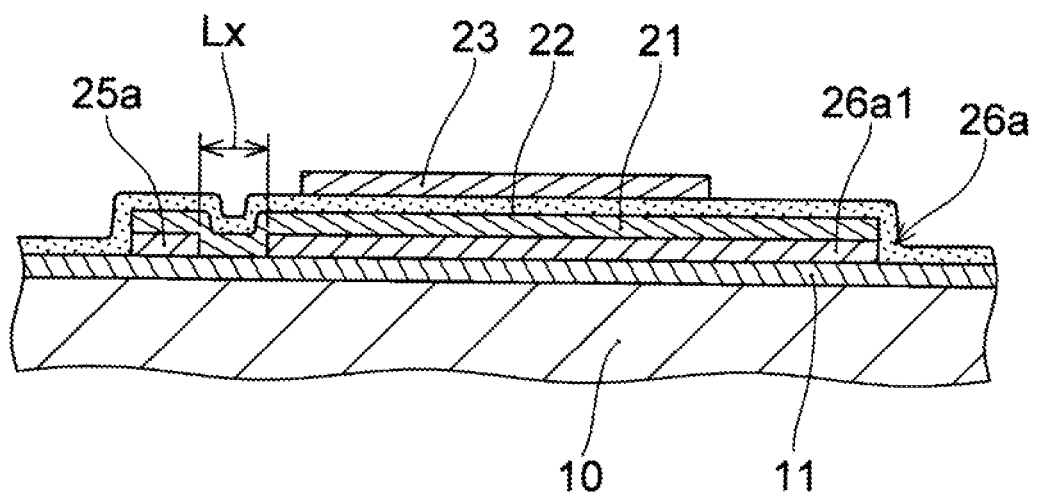
FIG. 4B shows a cross-sectional view of another example of the thin-film transistor of the organic-EL display apparatus according to one embodiment of the present invention.

FIGS. 4A and 4B show cross-sectional views along a cutting line being parallel to the X direction and passing through the first portion 26a1 of the first conductor layer 26a shown in FIG. 3A. Unlike the example in FIG. 3A, FIGS. 4A and 4B are examples in which the gate electrode 23 is provided in a width being smaller than the length Wa of the facing portion of a part of the first conductor layer 26a and a part of the second conductor layer 25a. FIG. 4A is an example in which the TFT 20 is of a bottom gate-type, while FIG. 4B is an example in which the TFT 20 is of a top gate-type. In other words, in FIG. 4A, the gate electrode 23, the gate insulating layer 22, the semiconductor layer 21, and the first conductor layer 26a being deposited over the substrate 10 via the base coat layer are formed in reverse order to those in FIG. 4B. In either one of FIGS. 4A and 4B, the tip of the first portion 26a1 of the first conductive layer 26a and the second conductive layer 25a are separated by a distance Lx. The distance Lx is generally equal to the interval between the first conductor layer 26a and the second conductor layer 25a facing each other along a direction (the Y direction shown in FIG. 3A) in which a part of the first conductor layer 26a and a part of the second conductive layer 25a are alternately lined up, for example.

With reference to FIGS. 2A to 2C again, constituting elements other than the TFT 20 of the organic-EL display apparatus 1 will be described. The planarizing layer 30 comprises a first inorganic insulating layer 31 being deposited on the drive circuit 2, an organic insulating layer 32 being deposited on the first inorganic insulating layer 31, and a second inorganic insulating layer 33 being deposited on the organic insulating layer 32. A surface of the planarizing layer 30 facing to an opposite orientation from the drive circuit 2 (a surface of the second inorganic insulating layer 33 facing to an opposite orientation from the organic insulating layer 32) has an arithmetic average roughness of 50 nm or less. In other words, according to the organic-EL display apparatus 1 according to the present embodiment, the surface of the substrate 10 having unevenness due to forming the drive circuit 2 is covered by the planarizing layer 30, and the surface of the planarizing layer 30 is formed to 50 nm or less in arithmetic average roughness (Ra). For example, the planarizing layer 30 can be formed to 50 nm or less in arithmetic average roughness by being polished after depositing of each insulating layer.

As described previously, as a result of the present inventors having made studies on the cause that display non-uniformity is produced in the organic-EL display apparatus, it was found that the surface of the organic light-emitting layer in the organic light-emitting element is not a completely planar surface, but comprises a minute unevenness, having a microscopically inclined portion. The surface of the organic light-emitting layer being inclined causes the normal direction of the surface of the organic light-emitting layer to incline relative to the normal direction of the display surface of the organic-EL display apparatus. In such a case, it becomes difficult to recognize a light emitted in the slanted direction from such an organic light-emitting layer from the front of the display surface. Therefore, deterioration in luminance, or variation in chromaticity determined by the intensity of light of each color of R, G, and B occurred.

Conventionally, a circuit was added to each drive circuit provided for each pixel to compensate for the characteristic variations of the TFT and/or the OLED, for example, as measures for the display non-uniformity. However, these measures did not effectively function as measures for the display non-uniformity found by the present inventors, but rather could increase unevenness of the surface of the substrate with an increase in the number of constituting elements of the drive circuit. Moreover, currents to pass through individual organic light-emitting elements could be controlled based on the luminance distribution grasped by the inspection process of the organic-EL display apparatus. However, these measures caused the cost and size to increase in conjunction with an increase in the number of constituting elements of the drive circuit, complication of the manufacturing process of the organic-EL display apparatus, or complicated control to be needed.

On the other hand, in the present embodiment, as described previously, in order to eliminate the newly found cause of display non-uniformity, the surface of the planarizing layer 30 is brought to the arithmetic average roughness of 50 nm or less. Moreover, the organic light-emitting layer 43 is formed avoiding the position directly above a contact hole 30a to be described below. In this way, a display image having an extremely small display non-uniformity can be obtained. While the surface roughness of the planarizing layer 30 being smaller is more preferable, the arithmetic average roughness being such as to be set as a target in the polishing process in the semiconductor process, for example, to be less than 20 nm, is not necessarily required. In other words, the present inventors have found that, from a viewpoint of suppressing the display non-uniformity of the organic-EL display apparatus 1, it suffices that the surface of the planarizing layer 30 has the arithmetic average roughness of 50 nm or less, in which case the display non-uniformity such as to be detected by a human being is seldom produced. Moreover, it has been found that the arithmetic average roughness of 20 nm or more is preferable from the aspect of the ease of implementation. In other words, in view of coping with both easy manufacture and effective suppression of the display non-uniformity that can influence the display quality, it is preferable that the surface of the planarizing layer 30 having the arithmetic average roughness of 20 nm or more and 50 nm or less.

For the substrate 10, a glass substrate or a polyimide layer is mainly used. In a case that the organic-EL display apparatus 1 is of a bottom emission-type (BE-type) unlike the examples in FIGS. 2A to 2C, a light-transmitting material, or, in other words, a glass substrate, a transparent polyimide film, or the like can be used. The base coat layer 11 is formed as a barrier layer on the surface of the substrate 10 on which the TFT 20 is formed. For example, using plasma CVD, the base coat layer 11 is formed having an underlayer mainly comprising an $SiO_2$ layer having a thickness of approximately 500 nm and an $SiN_X$ layer having a thickness of approximately 50 nm, and an overlayer mainly comprising an $SiO_2$ layer having a thickness of approximately 250 nm.

The drive circuit 2 comprising the TFT 20 is formed over the base coat layer 11. The cathode wiring 27 is also formed over the base coat layer 11. While being omitted in FIG. 2A, wirings for scanning lines and data lines are also formed in the same manner as the cathode wiring 27. Moreover, while only the TFT 20 to drive the light-emitting element 40 is shown in FIG. 2A, the previously-described switching TFT 2a is also formed on the base coat layer 11, and other TFTs can also be formed thereon. In a case that the organic-EL display apparatus 1 is of the TE-type as the example in FIG. 2A, the drive circuit 2 can be formed across the entire surface below a light-emitting region of the organic light-emitting element 40. On the other hand, with the BE-type, the TFT 20 cannot be formed below the light-emitting region of the organic light-emitting element 40, so that the TFT 20 is formed at the peripheral edge of a portion overlapping in planar view with the light-emitting region. However, even in this case, the planarizing layer 30 is required that has, at the surface thereof, the planarity of such a degree as to not produce the display non-uniformity.

The gate insulating layer 22 of the TFT 20 mainly comprises $SiO_2$ of approximately 50 nm in thickness, while the gate electrode 23 is formed by patterning after forming a layer of Mo, for example, of approximately 250 nm in thickness.

A first inorganic insulating layer 31 comprising $SiN_X$ of approximately 200 nm in thickness is formed as a barrier layer on the surface of the drive circuit 2 comprising the TFT 20, an organic insulating layer 32 is formed over the first inorganic insulating layer 31, and a second inorganic insulating layer 33 is formed thereover. In the planarizing layer 30, the contact hole 30a is formed, which collectively penetrates the first inorganic insulating layer 31, the organic insulating layer 32, and the second inorganic insulating layer 33. As described below, a metal such as indium tin oxide (ITO), and silver (Ag), or APC (silver, copper and palladium), for example, is embedded into the contact hole 30a, and the drive circuit 2 and the organic light-emitting element 40 are connected to each other via this metal.

The organic insulating layer 32 has a thickness of approximately 1 μm or more and 2 μm or less, for example. The unevenness of the surface of the substrate 10 due to forming of the drive circuit 2 is substantially reduced by the organic insulating layer 32. The organic insulating layer 32 is formed using a polyimide resin or an acrylic resin, for example. Moreover, the organic insulating layer 32 preferably comprises an additive agent (a leveling improving agent) to improve the planarity of the surface of the organic insulating layer 32 facing the second inorganic insulating layer 33, at the content of 0.5 mass % or more and 5.0 mass % or less. Examples of such a leveling improving agent include silicone-based, hydrocarbon-based, and fluorine-based surfactants. Moreover, while the organic insulating layer 32 can be formed using a photosensitive resin, a photopolymerization initiator can reduce the effect of the leveling improving agent, so that a material not comprising a photosensitive body such as a photopolymerization initiator is preferably used for the organic insulating layer 32.

The acrylic resin is high in purity, fits well with a surfactant, and has a high planarity, so that it is preferable as a material for the organic insulating layer 32. On the other hand, in a case that the manufacturing process of the organic-EL display apparatus 1 comprises a process of high temperature of 200° C. or more, a polyimide resin having a high heat resistance is preferable. Therefore, the organic insulating layer 32 is preferably an acrylic resin not comprising a photosensitive body such as a photopolymerization initiator, or a polyimide resin not comprising the photosensitive body.

The second inorganic insulating layer 33 has the arithmetic average roughness of 50 nm or less at the surface facing to the opposite orientation from the organic insulating layer 32 as described previously, therefore, the display non-uniformity of the organic-EL display apparatus 1 can be suppressed. While the second inorganic insulating layer 33 is formed of $SiN_X$ or $SiO_2$, for example, $SiN_X$ is preferable in terms of barrier properties to moisture. In other words, the barrier performance to moisture of the planarizing layer 30 is improved by the second inorganic insulating layer 33.

The second inorganic insulating layer 33 can also have an effect of blocking moisture at the time of not only use of but also manufacturing of the organic-EL display apparatus 1. In other words, as described below, the surface of the planarizing layer 30 can be polished in the manufacturing process so as to have the surface roughness of 50 nm or less and cleaning can be carried out to remove the polishing agent after polishing. In a case that the second inorganic insulating layer 33 is not formed, the surface of the organic insulating layer 32 is to be polished and further to be exposed to the cleaning agent. In that case, the cleaning agent can penetrate into the organic insulating layer 32, remain as it is, and cause deterioration of the TFT 20. However, by the second inorganic insulating layer 33 being formed, such a penetration of the cleaning agent into the organic insulating layer 32 and such a deterioration of the TFT 20 can be prevented.

The second inorganic insulating layer 33 is formed so as to have the thickness of approximately 100 nm or more and 600 nm or less, for example. However, the thickness of the second inorganic insulating layer 33 varies based on the unevenness of the surface of the organic insulating layer 32 facing to the second inorganic insulating layer 33. The second inorganic insulating layer 33 is preferably formed so as to have a thickness of equal to or more than three times a maximum height difference DT of the unevenness of the surface of the organic insulating layer 32, for example, such that the unevenness of the surface of the organic insulating layer 32 can be sufficiently embedded in the second inorganic insulating layer 33. Then, it is preferable that the surface of the second inorganic insulating layer 33 be polished, as needed, for the length (the thickness) of equal to or more than maximum height difference DT and less than two times the maximum height difference DT. In this way, without exposing the organic insulating layer 32, it is possible to trim the protrusion of the surface of the second inorganic insulating layer 33 due to the protrusion of the surface of the organic insulating layer 32 and the surface of the planarizing layer 30 can be almost certainly brought to the arithmetic average roughness of 50 nm or less. In that case, over the entirety of the surface of organic insulating layer 32, the second inorganic insulating layer 33 can have the thickness of equal to or more than one times the maximum height difference DT and equal to or less than three times the maximum height difference DT of the unevenness of the surface of the organic insulating layer 32. For example, in FIG. 2A, a maximum thickness TL of the second inorganic insulating layer 33 is equal to or more than two times the maximum height difference DT and equal to or less than three times the maximum height difference DT of the unevenness of the organic insulating layer 32, while a minimum thickness TM of the second inorganic insulating layer 33 is equal to or more than one times the maximum height difference DT and equal to or less than two times the maximum height difference DT of the unevenness of the organic insulating layer 32. In particular, in the example in FIG. 2A, the maximum thickness TL of the second inorganic insulating layer 33 is substantially two times the maximum height difference DT of the unevenness of the organic insulating layer 32, while the minimum thickness TM of the second inorganic insulating layer 33 is substantially the same as the maximum height difference DT of the unevenness of the organic insulating layer 32.

The first electrode 41 of the organic light-emitting element 40 is formed integrally with the metal being embedded into the contact hole 30a. In other words, ITO, a metal such as Ag or APC, and ITO are embedded into the contact hole 30a using sputtering, for example, and an ITO layer, a metal layer such as Ag layer or APC layer, and an ITO layer which are composed of the same substances as the inside of the contact hole 30 are also formed on the surface of the planarizing layer 30. These are patterned to a given shape, so that the first electrode 41 is formed. However, as described previously, the region at which the organic light-emitting layer 43 is formed is set so as to avoid the position directly above the contact hole 30a. In relation to the organic light-emitting layer 43, the first electrode 41 preferably has a work function of approximately 5 eV, so that, in a case of the top emission-type, ITO, and Ag or APC as described previously are used. The ITO layer is formed so as to have the thickness of approximately 10 nm, while the Ag or APC layer is formed so as to have the thickness of approximately 100 nm. In a case of the bottom emission-type, only the ITO layer having the thickness of approximately 300 nm or more and 1 μm or less is formed, for example. In the planarizing layer 30, a contact hole 30b to form the cathode contact 44a is also formed, and the contact hole 30b also collectively penetrates each insulating layer making up the planarizing layer 30.

In a portion directly above the contact hole 30a of the surface of the first electrode 41 can be produced a hollow as shown in FIG. 2A in a case that the contact hole 30a is not completely filled with ITO. However, in the example in FIG. 2A, the first electrode 41 has a region not overlapping in planar view with the contact hole 30a at a size being sufficient to form the organic light-emitting layer 43, and the organic light-emitting layer 43 is formed at the region not overlapping with the contact hole 30a. Therefore, the non-uniformity of thickness of the organic light-emitting layer 43 and the hollow at the surface thereof is unlikely to be produced, and the display non-uniformity caused by the contact hole 30a is unlikely to be produced.

The insulating bank 42 to insulate the first electrode 41 from the second electrode 44 as well as to demarcate each pixel is formed at the peripheral edge of the first electrode 41. In the example in FIG. 2A, the hollow of the surface of the first electrode 41 is covered with the insulating bank 42. Then, the organic light-emitting layer 43 is deposited on the first electrode 41 being surrounded by the insulating bank 42. The organic light-emitting layer 43 to be a light-emitting region of the organic light-emitting element 40 is formed preferably at a region not overlapping in planar view with the contact hole 30a as in the example in FIG. 2A. In that case, as described previously, the display non-uniformity caused by the contact hole 30a is unlikely to be produced. While the organic light-emitting layer 43 is shown as one layer in FIG. 1, it is formed as a plurality of organic layers by depositing various materials. The organic light-emitting layer 43 is formed by printing, or vapor deposition in which an organic material being evaporated or sublimed is selectively adhered onto only a required portion using a mask.

As a layer to be in contact with the first electrode 41, for example, a positive hole injection layer is provided, which comprises a to material having a high compatibility with ionization energy to improve the injectability of positive holes. A positive hole transport layer allowing trapping of electrons into the light-emitting layer (as the energy barrier) as well as improving the stable transport of positive holes is formed by an amine-based material, for example, on the positive hole injection layer. Moreover, the light-emitting layer is formed on the positive hole transport layer, which is selected in accordance with a wavelength of light to be emitted. For example, an organic luminescence material of red or green is doped to $Alq_3$ for red or green, for example. Moreover, as a blue-color material, a DSA-based organic material is used. Furthermore, on the light-emitting layer, an electron transport layer to stably transport electrons as well as to improve the injectability of electrons is formed by $Alq_3$. These individual layers, each having a thickness of approximately several tens of nm, are deposited to form a deposited organic light-emitting layer 43. An electron injection layer made of, for example, LiF or Liq to improve the injectability of electrons can be provided between the organic light-emitting layer 43 and the second electrode 44.

The second electrode 44 is formed over the organic light-emitting layer 43. In the examples in FIG. 2A to 2C, the second electrode 44 is continuously formed so as to be common across all the pixels, and is connected to the cathode wiring 27 via the cathode contact 44a formed in the planarizing layer 30. The second electrode 44 is formed by a light-transmitting material, for example, a thin-film Mg—Ag layer. For the second electrode 44, a material having a small work function is preferable, so that an alkaline metal, or an alkaline earth metal can be used. Mg (magnesium) is preferable in having a small work function of 3.6 eV, and Ag having a small work function of approximately 4.25 eV is co-vapor deposited at the ratio of approximately 10 mass % to provide stability. With the BE-type, the second electrode 44 is a reflecting plate, so that Al (aluminum) is thickly deposited as the second electrode 44.

An encapsulation layer (TFE) 46 to prevent moisture from reaching to the second electrode 44 is formed over the second electrode 44. The encapsulation layer 46, comprising an inorganic insulating layer such as $SiN_x$ or $SiO_2$, for example, is formed by forming a single-deposited film, or two or more layers of deposited film. For example, two layers of deposited film in which the thickness of each layer is approximately between 0.1 μm and 0.5 μm are formed as the encapsulation layer 46. The encapsulation layer 46 is preferably formed in a multilayer using different materials so as to obtain sufficient barrier property with respect to moisture even when a pin hole is created in one layer. The encapsulation layer 46 is formed such as to completely coat the organic light-emitting layer 43 and the second electrode 44. The encapsulation layer 46 can comprise an organic insulating layer in between two layers of inorganic insulating layer.

(Method of Manufacturing an Organic-EL Display Apparatus)

Herein below, with the organic-EL display apparatus 1 shown in FIG. 2A as an example, a method of manufacturing an organic-EL display apparatus according to one embodiment is explained with reference to flowcharts in FIGS. 5A and 5B and to cross-sectional views shown in FIGS. 6A to 6G and also with reference to FIG. 3A as needed.

Figure 5A:
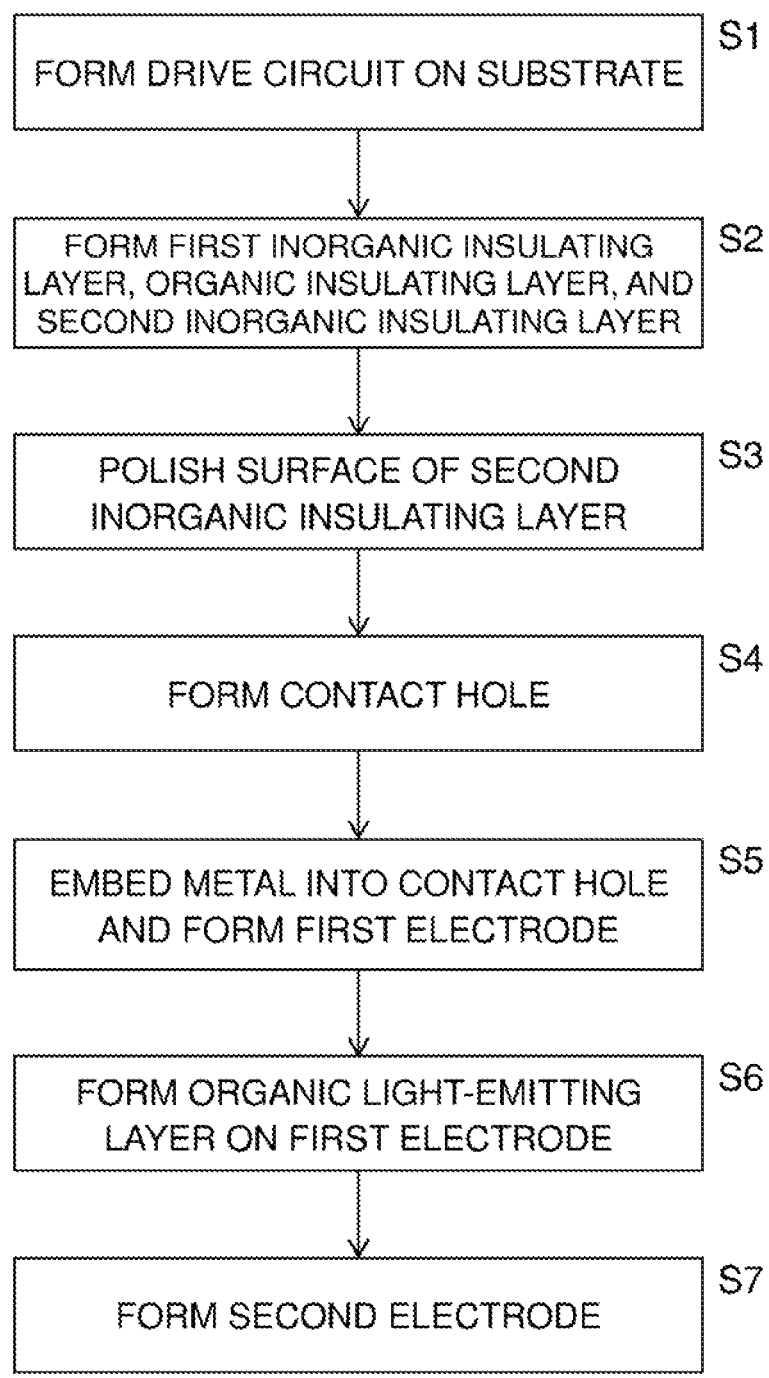
FIG. 5A shows a flowchart of a method of manufacturing an organic-EL display apparatus according to one embodiment of the present invention.
Figure 6A:
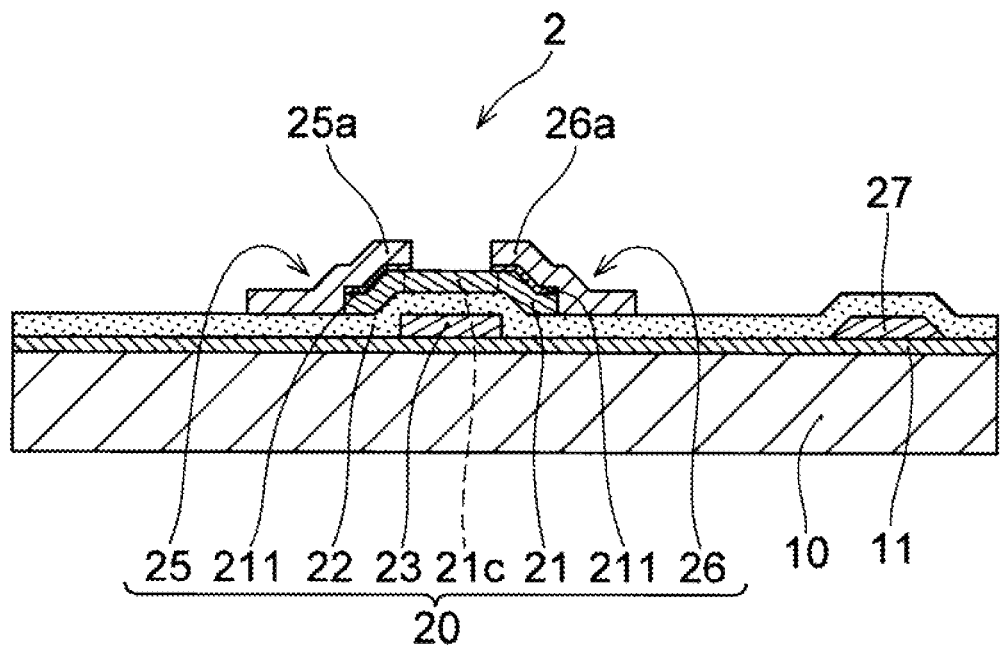
FIG. 6A is a cross sectional view showing the method of manufacturing an organic-EL display apparatus according to one embodiment of the present invention.

As shown in FIG. 6A, a drive circuit 2 comprising a thin-film transistor 20 is formed on a substrate 10 (S1 in FIG. 5A).

In a case that the organic-EL display apparatus 1 shown in FIG. 2A is manufactured, a base coat layer 11 is formed on the surface of the substrate 10 using plasma CVD, for example. While the base coat layer 11 is shown with a single layer structure in FIG. 6A, it is formed, for example, by depositing an $SiO_2$ layer having a thickness of approximately 500 nm, an $SiN_x$ layer having a thickness of approximately 50 nm on the $SiO_2$ layer, and further an $SiO_2$ layer having a thickness of approximately 250 nm on the $SiN_x$ layer.

Thereafter, a gate electrode 23 is formed by forming a metal layer such as Mo layer using sputtering, for example, and patterning the metal layer (S11 in FIG. 5B). Preferably, along with the gate electrode 23, a cathode wiring 27 and each wiring (not shown) for other lines such as scanning lines and data lines can be formed. For example, as shown in the FIG. 3A previously referred to, the gate electrode 23 extending in a given direction (Y direction in the example in FIG. 3A) in which a part of the first conductor layer 26a and a part of the second conductor layer 25a are alternately lined up is formed.

A gate insulating layer 22 is formed on the gate electrode 23 (S12 in FIG. 5B). The gate insulating layer 22 is formed by forming an $SiO_2$ layer or an $SiN_x$ layer having a thickness of approximately 50 nm using plasma CVD, for example. Moreover, a semiconductor layer 21 made up of amorphous silicon is formed on the gate insulating layer 22, using plasma CVD, for example, such that the semiconductor layer 21 covers the gate electrode 23 (S13 in FIG. 5B). A dehydrogenation process on the semiconductor layer 21 is carried out by annealing for approximately 45 minutes under the temperature of approximately 350° C., for example. The semiconductor layer 21 is patterned into a desired shape using, for example, dry etching. As described previously, in a case that the gate electrode 23 extends in a given direction in which a part of the first conductor layer 26a and a part of the second conductor layer 25a are alternately lined up, the semiconductor layer 21 extending along the given direction to cover the entire gate electrode 23 is formed.

Thereafter, a second semiconductor layer 211 having a high impurity concentration is preferably formed at a region on the semiconductor layer 21, on which the first conductor layer 26a or the second conductor layer 25a is to be formed later (S14 in FIG. 5B). In other words, interposing the second semiconductor layer 211 having a high impurity concentration between the semiconductor layer 21 and each of the first conductor layer 26a and the second conductor layer 25a is preferable in reducing the contact resistance between the semiconductor layer 21, and a drain electrode 26 and a source electrode 25. The second semiconductor layer 211 can be formed on the semiconductor layer 21 by depositing a semiconductor layer having an impurity concentration higher than that of the semiconductor layer 21, or it can be formed by doping impurities into a given region of the semiconductor layer 21. As impurities, phosphorus or arsenic can be exemplified in a case that the TFT 20 is a N-channel field-effect transistor, while boron or aluminum can be exemplified in a case that the TFT 20 is a P-channel field-effect transistor.

The first conductor layer 26a making up the drain electrode 26 and the second conductor layer 25a making up the source electrode 25 are formed on the semiconductor layer 21 (or the second semiconductor layer 211) and the gate insulating layer 22 (S15 in FIG. 5B). For example, a titanium layer or an aluminum layer each having a thickness of several hundreds of nm, or a deposited layer thereof is formed using sputtering. Then, by dry etching, for example, the formed metal layer is separated into the first conductor layer 26a and the second conductor layer 25a, and unneeded portions are removed. As a result, the first conductor layer 26a comprising a plurality of first portions (four first portions 26a1 to 26a4 in the example in FIG. 3A) extending along a direction (the X direction in FIG. 3A, for example) crossing a given direction (the Y direction in FIG. 3A, for example) is formed. At the same time, the second conductor layer 25a comprising a plurality of second portions (four second portions 25a1 to 25a4 in the example in FIG. 3A) extending along a direction crossing the given direction (the Y direction in FIG. 3A) is formed. The first conductive layer 26a and the second conductor layer 25a are formed such that each of the plurality of first portions and each of the plurality of second portions are alternately arranged along the given direction (the Y direction in FIG. 3A). As a result, the TFT 20 is formed over the substrate 10. As shown in FIG. 6A, the TFT 20 is formed so as to have a deposition structure of the gate electrode 23, the gate insulating layer 22, the semiconductor layer 21, the first conductor layer 26a making up the drain electrode 26, and the second conductor layer 25a making up the source electrode 25. Moreover, as exemplified in FIG. 3A, the first conductor layer 26 and the second conductor layer 25 are formed such that a part of each thereof is alternately lined up along the given direction. And the semiconductor layer 21 comprises a region to be a channel 21c being a region sandwiched between a part of the first conductor layer 26a and a part of the second conductor layer 25a.

Each of the first conductor layer 26a and the second conductor layer 25a can be formed so as to have a comb shape in planar view as in the example in FIG. 3A. Also, the first conductor layer 26a and the second conductor layer 25a can be formed such that comb tooth portions (the first portions 26a1 to 26a4 in the example in FIG. 3A) of the first conductor layer 26a and comb tooth portions (the second portions 25a1 to 25a4 in the example in FIG. 3A) of the second conductor layer 25a engage with each other.

In a case that the top gate-type TFT 20 as exemplified in FIG. 2B is formed, each constituting element is formed using generally the same method as that for forming the bottom gate-type TFT 20 as exemplified in FIG. 2A, but in a procedure being generally reverse to the procedure described above. In other words, first, the first conductor layer 26a comprising a plurality of first portions (four first portions 26a1 to 26a4 in the example in FIG. 3A) extending along a direction (the X direction in FIG. 3A, for example) crossing a given direction (the Y direction shown in FIG. 3A, for example) is formed on the substrate 10. Moreover, along with the first conductor layer 26a being formed, the second conductor layer 25a comprising a plurality of second portions (four second portions 25a1 to 25a4 in the example in FIG. 3A) extending along a direction crossing the given direction (the Y direction in FIG. 3A) is formed. The first conductor layer 26a and the to second conductor layer 25a are formed such that each of the plurality of first portions and each of the plurality of second portions are alternately arranged along the given direction (the Y direction in FIG. 3A).

Thereafter, the semiconductor layer 21 made of amorphous silicon is formed on the first conductor layer 26a and the second conductor layer 25a. Preferably, a semiconductor layer 21 is formed, which extends along the given direction in which each of the plurality of first portions of the first conductor layer 26a and each of the plurality of second portions of the second conductor layer 25a are alternately arranged. Then, the gate insulating layer 22 is formed on the semiconductor layer 21 and the gate electrode 23 is formed, on the gate insulating layer 22, so as to cover a portion at which the first portion of the first conductor layer 26a and the second portion of the second conductor layer 25a face each other. Preferably, a gate electrode 23 is formed, which extends along the given direction in which each of the plurality of first portions of the first conductor layer 26a and each of the plurality of second portions of the second conductor layer 25a are alternately lined up.

Moreover, in a case that the top gate-type TFT 20 being exemplified in FIG. 2C is formed, the semiconductor layer 21, the gate insulating layer 22, the gate electrode 23, an interlayer insulating layer 24, the drain electrode 26 (the first conductor layer 26a), and the source electrode 25 (the second conductor layer 25a) are formed in order over the substrate 10. An excimer laser is irradiated to the semiconductor layer 21 and amorphous silicon is converted into polysilicon (LTPS) by such an annealing. Moreover, impurity ions are to doped into regions to be a source 21s and a drain 21d in the semiconductor layer 21. Contact holes 24a are formed by, for example, dry etching in the interlayer insulating layer 24 and the gate insulating layer 22, and filed up with a metal at the time of forming the drain electrode 26 and the source electrode 25.

Figure 6B:
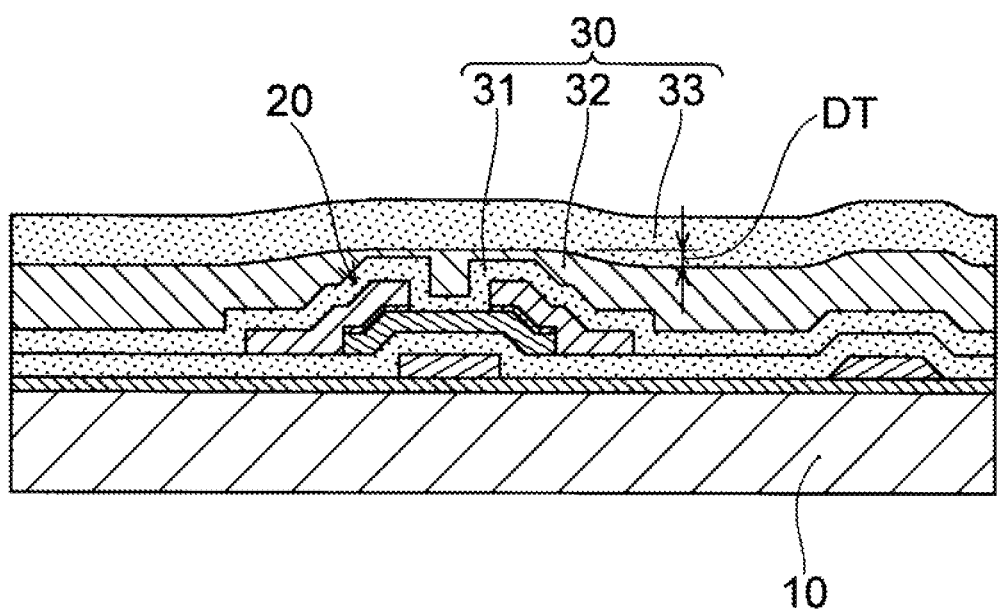
FIG. 6B is a cross sectional view showing the method of manufacturing an organic-EL display apparatus according to one embodiment of the present invention.

Thereafter, as shown in FIG. 6B, a first inorganic insulating layer 31, an organic insulating layer 32, and a second inorganic insulating layer 33 are formed (S2 in FIG. 5A) on the surface of the drive circuit 2 (see FIG. 6A). The first inorganic insulating layer 31 is formed by forming a layer of, for example, $SiN_x$ or $SiO_2$ having a thickness of approximately 200 nm using plasma CVD, for example. The organic insulating layer 32 is formed by applying a liquid resin or a pasty resin of low viscosity. Slit coating or spin coating, and slit and spin coating in which both thereof are combined can be exemplified as methods of applying. The organic insulating layer 32 is formed so as to have a thickness of approximately 1 μm or more and 2 μm or less. As a material for the organic insulating layer 32, a polyimide resin or an acrylic resin can be used, for example. A non-photosensitive resin not comprising the photosensitive body is preferable in that it is high in purity and, even more, the surface smoothness of the organic insulating layer 32 is high. Particularly, the acrylic resin is preferable.

The second inorganic insulating layer 33 is formed by forming a layer consisting of, for example, $SiN_x$ or $SiO_2$ using plasma CVD, for example, in the same manner as forming the first inorganic insulating layer 31. Forming the second inorganic insulating layer 33 makes it possible to prevent penetration, into the organic insulating layer 32, of various solvents such as a cleaning agent that can be used in a post-process, and the possibly-resulting deterioration of the TFT 20.

The second inorganic insulating layer 33 is preferably formed so as to have a thickness to be selected based on a maximum height difference DT of the unevenness of the surface of the organic insulating layer 32. For example, the second inorganic insulating layer 33 is formed so as to have a thickness equal to or more than twice the maximum height difference DT of the unevenness of a surface of the organic insulating layer 32 facing to the second inorganic insulating layer 33. This makes it possible to ensure that a recess on the surface of the organic insulating layer 32 be filled by a part of the second inorganic insulating layer 33. Moreover, the second inorganic insulating layer 33 is more preferably formed so as to have a thickness of equal to or more than two times the maximum height difference DT and equal to or less than three times the maximum height difference DT of the unevenness of the surface of the organic insulating layer 32. This makes it possible to surely fill the recess of the organic insulating layer 32 as described previously. Moreover, in the below-described polishing process, it is possible, without unnecessarily thickening the second inorganic insulating layer 33, to certainly level the unevenness that is based on the unevenness of the organic insulating layer 32 and can appear on the surface of the second inorganic insulation layer 33 after formation thereof. Even more, it is possible to almost certainly prevent the organic insulating layer 32 from being exposed after the polishing.

Figure 6C:
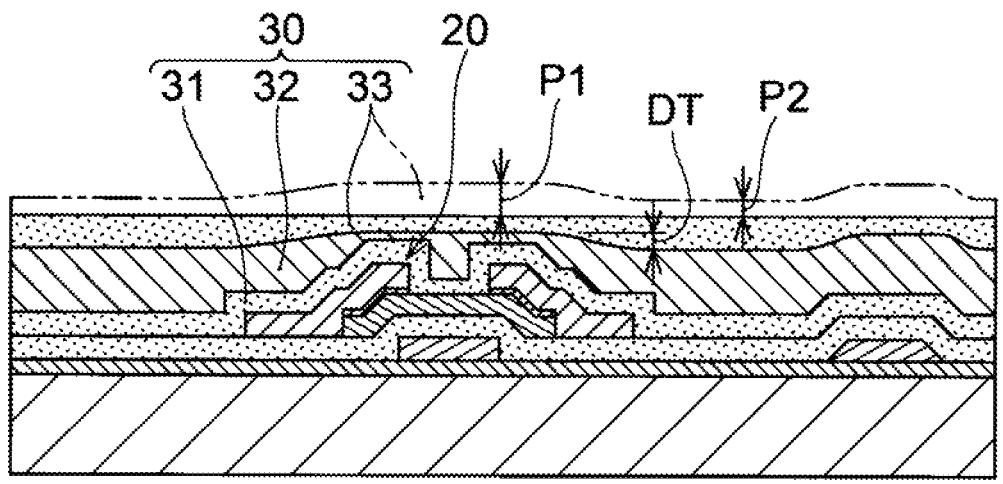
FIG. 6C is a cross sectional view showing the method of manufacturing an organic-EL display apparatus according to one embodiment of the present invention.

Next, as shown in FIG. 6C, the surface of the second inorganic insulating layer 33 is polished (S3 in FIG. 5A). It has been found by the present inventors that, as described previously, in a case that the surface of the planarizing layer 30 to be the base for an organic light-emitting element 40 (see FIG. 2A) is not sufficiently planar, the display non-uniformity can be produced in the organic-EL display apparatus. Therefore, the surface of the second inorganic insulating layer 33 being the surface of the planarizing layer 30 is polished. The surface of the second inorganic insulating layer 33 is preferably polished so as to have an arithmetic average roughness of 50 nm or less. Polishing the surface to the surface roughness of such a degree and, moreover, forming an organic light-emitting layer 43 avoiding the position directly above the contact hole 30a as described later make it possible to ensure that a display non-uniformity such as to be detected by a human being be seldom produced as described previously. Moreover, in planarization of the surface of the planarizing layer 30, the arithmetic average roughness such as to be set as a target in the semiconductor process is not necessarily required. Rather, in order to avoid a complicated and time-consuming polishing process including an inspection of the surface roughness, the surface of the second inorganic insulating layer 33 is preferably polished so as to have an arithmetic average roughness of 20 nm or more and 50 nm or less.

In polishing of the surface of the second inorganic insulating layer 33, the second inorganic insulating layer 33 is polished such that the polishing amount (the amount of decrease in thickness of the second inorganic insulating layer 33 due to polishing) at least partially reaches an amount equal to or more than one times the maximum height difference DT and less than two times the maximum height difference DT of the unevenness of the surface of the organic insulating layer 32. In this way, in a case that the second inorganic insulating layer 33 is formed so as to have the thickness of equal to or more than twice the maximum height difference DT of the unevenness of the organic insulating layer 32 as described previously, unevenness that can appear on the surface of the second inorganic insulating layer 33 after formation thereof based on the unevenness of the organic insulating layer 32 can surely be leveled. Even more, it is possible to almost certainly prevent the exposure of the organic insulating layer 32 due to polishing. For example, in the example in FIG. 6C, a polishing amount P1 in a region (for example, a region in which the TFT 20 is formed) being a protrusion at the surface of the second inorganic insulating layer 33 after formation thereof is around twice the maximum height difference DT of the unevenness at the surface of the organic insulating layer 32. Moreover, in the example in FIG. 6C, a polishing amount P2 in a region (for example, a region in which the TFT 20 is not formed) being a recess at the surface of the second inorganic insulating layer 33 after formation thereof is an amount being substantially the same as but slightly below the maximum height difference DT of the unevenness of the organic insulating layer 32.

Method of polishing the second inorganic insulating layer 33 is not particularly limited. However, in order to achieve the arithmetic average roughness of 50 nm or less, polishing is preferably carried out by CMP (chemical mechanical polishing) in which a neutral slurry containing cerium, colloidal silica, or fumed silica is used as a polishing agent. The CMP makes it possible to increase the effect of mechanical polishing through surface chemical action which the polishing agent has, for example, and to rapidly obtain a smoothly polished surface. Cerium can be an effective polishing agent for the second inorganic insulating layer 33 being formed of $SiO_2$ since Cerium has high hardness and a Ceria ($CeO_2$) being an oxide of Cerium causes a chemical reaction with glass. Colloidal silica refers to a colloidal hydrated $SiO_2$ or colloidal $SiO_2$ normally having the particle diameter of 10 nm to 300 nm, while fumed silica (also called a dry silica or a highly-dispersed silica) refers to spherical $SiO_2$ particles having the particle diameter of 10 nm to 30 nm being aggregated (the particle diameter of 100 nm to 400 nm), and both thereof effectively function as polishing agents.

Moreover, for polishing of the second inorganic insulating layer 33, neutral aqueous alcohol or potassium hydroxide aqueous solution is used together with the previously-described polishing agent. In particular, in a case that the substrate 10 is formed of a polyimide resin, from a viewpoint of preventing corrosion of the substrate 10, the surface of the second inorganic insulating layer 33 is preferably polished using the neutral alcohol solution together with the previously-described polishing agent.

Figure 6D:
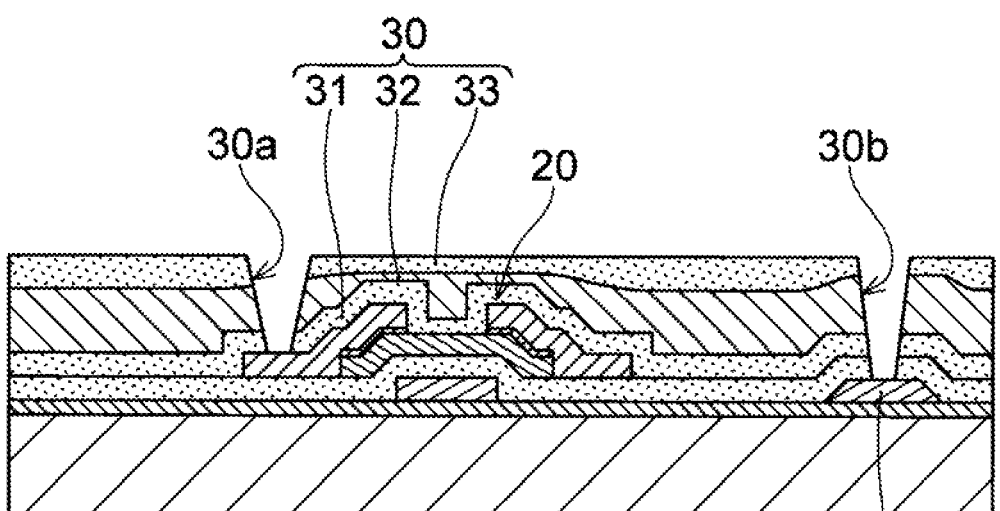
FIG. 6D is a cross sectional view showing the method of manufacturing an organic-EL display apparatus according to one embodiment of the present invention.

As shown in FIG. 6D, a contact hole 30a is formed (S4 in FIG. 5A) in the second inorganic insulating layer 33, the organic insulating layer 32, and the first inorganic insulating layer 31, so as to reach the drive circuit 2 (see FIG. 6A). Preferably, the contact hole 30a to collectively penetrate these three insulating layers is formed. The contact hole 30a is preferably formed at a region not overlapping, in the thickness direction of the substrate 10, with a region at which an organic light-emitting layer 43 (see FIG. 6F) is to be formed in a formation of the organic light-emitting layer 43 to be described below. This makes it possible to prevent the occurrence of display non-uniformity as described previously. Forming of the contact hole 30a is carried out using dry etching after a resist mask is formed, for example. At the time of forming the contact hole 30a, the contact hole 30b for a cathode contact 44a (see FIG. 2A) is formed also in a portion above the cathode wiring 27 of the planarizing layer 30.

Figure 6E:
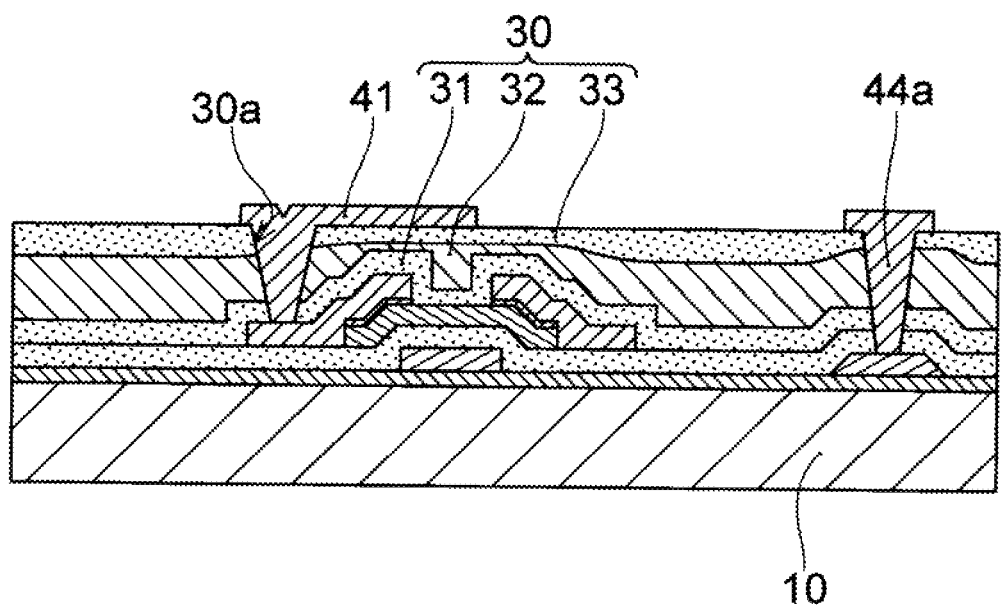
FIG. 6E is a cross sectional view showing the method of manufacturing an organic-EL display apparatus according to one embodiment of the present invention.

As shown in FIG. 6E, a metal is embedded at the interior of the contact hole 30a and a first electrode 41 of the organic light-emitting element 40 (see FIG. 2A) is formed in a given region (S5 of FIG. 5A). More specifically, using sputtering, for example, an underlayer in which are deposited an ITO layer having a thickness of approximately 10 nm, and an Ag layer or an APC layer having a thickness of approximately 100 nm, and an overlayer mainly comprising an ITO layer having a thickness of approximately 10 nm are formed. As a result, a deposited layer consisting of the ITO layer, the Ag layer or the APC layer, and the ITO layer is formed on the surface of the planarizing layer 30 as well as the metal is embedded at the interior of the contact hole 30a. Thereafter, the deposited layer is patterned to form the first electrode 41. As shown in FIG. 6E, this deposited layer is preferably patterned such that the first electrode 41 has a region having a sufficient size with respect to forming of the organic light-emitting layer 43 and not overlapping with the contact hole 30a in planar view. At the time of embedding the metal into the contact hole 30a, the contact hole 30b is filled at least with the ITO layer, and the Ag layer or APC layer, so that the cathode contact 44a is formed.

Figure 6F:
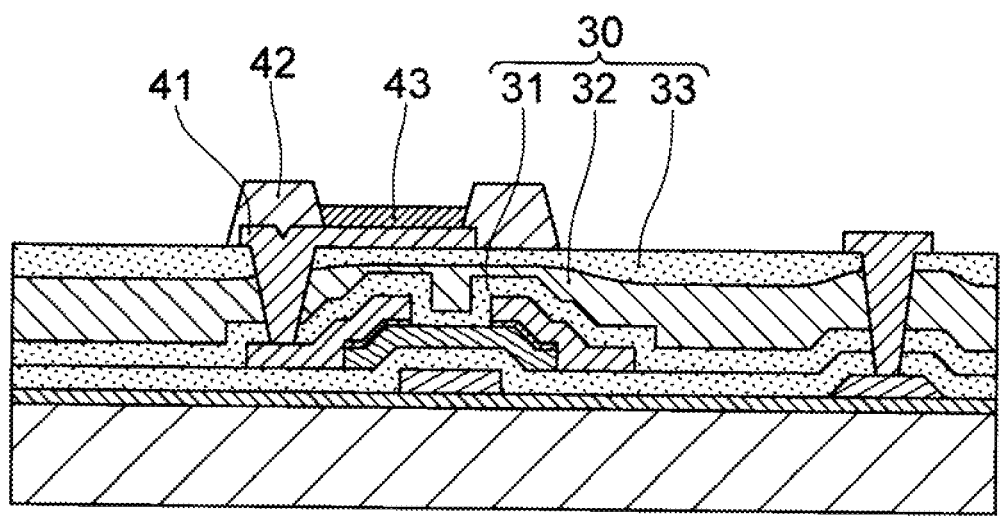
FIG. 6F is a cross sectional view showing the method of manufacturing an organic-EL display apparatus according to one embodiment of the present invention.

As shown in FIG. 6F, the organic light-emitting layer 43 is formed on the first electrode 41 (S6 in FIG. 5A). Specifically, an insulating bank 42 is formed at the peripheral edge of the first electrode 41. The insulating bank 42 can be an inorganic insulating layer such as $SiO_2$, or an organic insulating layer such as a polyimide resin or an acrylic resin. For example, such an insulating layer is formed on the entire surface of the first electrode 41 and the planarizing layer 30 and a given region of the first electrode 41 is exposed by the patterning the formed insulation layer. Preferably, a region of the first electrode 41, which does not overlap with the contact hole 30a in the thickness direction of the substrate 10 is exposed. The insulating bank 42 is formed so as to have a height of approximately 1 μm. As described previously, various organic materials are deposited in forming of the organic light-emitting layer 43. Depositing of the organic material is carried out by vacuum vapor deposition, for example, in which case the organic material is vapor-deposited via a vapor-deposition mask having an aperture corresponding to a desired pixel, such as R, G, or B. A layer such as LiF to improve the injectability of electrons can be formed on the surface of the organic light-emitting layer 43. The organic light-emitting layer 43 can be formed by inkjet printing, not vapor deposition.

Figure 6G:
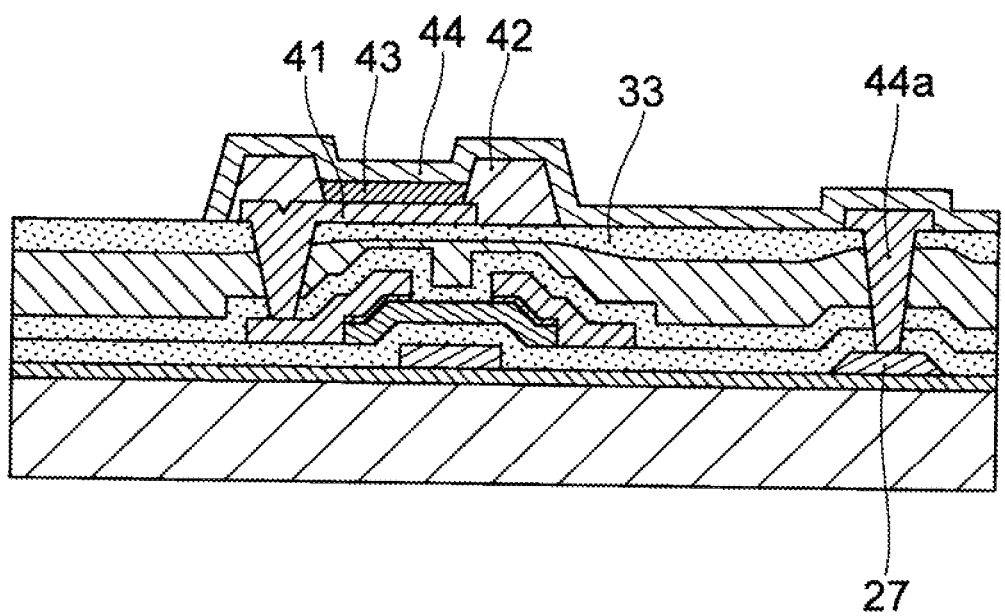
FIG. 6G is a cross sectional view showing the method of manufacturing an organic-EL display apparatus according to one embodiment of the present invention.

As shown in FIG. 6G, a second electrode 44 is formed on the organic light-emitting layer 43 (S7 in FIG. 5A). The second electrode 44 is formed by forming a thin-film of Mg—Ag eutectic film using co-vapor deposition, for example. The second electrode 44 is formed also on the cathode contact 44a and connected to the cathode wiring 27 via the cathode contact 44a. The Mg—Ag eutectic film comprises Mg at approximately 90 mass % and Ag at approximately 10 mass %, for example. The second electrode 44 is formed so as to have a thickness of approximately 10 to 20 nm, for example.

An encapsulation layer 46 (see FIG. 2A) to protect the second electrode 44 and the organic light-emitting layer 43 from, for example, moisture or oxygen is formed over the second electrode 44. The encapsulation layer 46 is formed by forming, using plasma CVD, an inorganic insulating layer such as $SiO_2$ or $SiN_x$. The encapsulation layer 46 is preferably formed such that the end portion thereof comes into close contact with an inorganic layer such as the second inorganic insulating layer 33. This is because joining of the inorganic layers together causes them to be joined in close contact with each other. This makes it possible to more surely prevent penetration of moisture. The organic-EL display apparatus 1 shown in FIG. 2A can be manufactured by undergoing the above-described process.

SUMMARY (1) An organic-EL display apparatus according to first embodiment of the present invention comprises: a substrate having a surface with a drive circuit formed on the surface, the drive circuit comprising a thin-film transistor; a planarizing layer to planarize the surface of the substrate by covering the drive circuit; and an organic light-emitting element being formed on a surface of the planarizing layer facing to an opposite orientation from the drive circuit, and electrically connected to the drive circuit, wherein the surface of the planarizing layer has an arithmetic average roughness of 50 nm or less; the thin-film transistor comprises a gate electrode, a drain electrode, a source electrode, and a semiconductor layer comprising a region to be a channel of the thin-film transistor and partially overlapping with the drain electrode and the source electrode; a part of a first conductor layer making up the drain electrode and a part of a second conductor layer making up the source electrode are alternately lined up along a given direction; and the region to be a channel is sandwiched between the part of the first conductor layer and the part of the second conductor layer.

The configuration according to (1) makes it possible to enhance the capability of a drive circuit with a structure also allowing realization of cost reduction and, even more, to reduce display non-uniformity in an organic-EL display apparatus.

(2) In the organic-EL display apparatus according to (1) mentioned above, the semiconductor layer can comprise a plurality of regions, each one of the plurality of regions being the region to be a channel being sandwiched between the part of the first conductor layer and the part of the second conductor layer, the semiconductor layer can be made of amorphous silicon, and W/L can be 50 or more and 500 or less, wherein the W denotes a sum of lengths of facing portions in the plurality of regions, each of the facing portions being a portion at which the part of the first conductor layer and the part of the second conductor layer face each other, and the L denotes an interval between the first conductor layer and the second conductor layer at the facing portions. In that case, a drive circuit having a high current-drive capability can be formed.

(3) In the organic-EL display apparatus according to (1) or (2) mentioned above, each of the first conductor layer and the second conductor layer can be formed into a comb shape in planar view and can be formed such that a comb tooth portion of the first conductor layer and a comb tooth portion of the second conductor layer engage with each other. In that case, a large number of facing portions of the part of the first conductor layer and the part of the second conductor layer can be efficiently formed.

(4) In the organic-EL display apparatus according to any one of (1) to (3) mentioned above, a light-emitting region of the organic light-emitting element can be formed in a rectangular shape, the thin-film transistor can be formed at an underlayer of the light-emitting region, and a portion at which the part of the first conductor layer and the part of the second conductor layer face each other can be formed along a long side of the rectangular shape. In that case, a TFT having a large channel width, able to fall into a pixel or a light-emitting region of a rectangular shape, and having a property being close to the design value can be obtained.

(5) In the organic-EL display apparatus according to any one of (1) to (4) mentioned above, the gate electrode can be formed over an entire range of a length of a portion at which the part of the first conductor layer and the part of the second conductor layer face each other. In that case, a TFT having a large channel width including the entire length of the portion at which the first conductor layer and the second conductor layer face each other.

(6) In the organic-EL display apparatus according to any one of (1) to (5) mentioned above, the planarizing layer can comprise a first inorganic insulating layer being deposited on the drive circuit; an organic insulating layer being deposited on the first inorganic insulating layer; and a second inorganic insulating layer being deposited on the organic insulating layer, and a surface of the second inorganic insulating layer facing to an opposite orientation from the organic insulating layer can have a surface roughness of 20 nm or more and 50 nm or less. In that case, it can be easily achieved to cope with both easy manufacture and effective suppression of the display non-uniformity that can influence the display quality.

(7) In the organic-EL display apparatus according to (6) mentioned above, a thickness of the second inorganic insulating layer can vary based on an unevenness of a surface of the organic insulating layer facing to the second inorganic insulating layer, and the thickness of the second inorganic insulating layer can be equal to or more than one times a maximum height difference of the unevenness and equal to or less than three times the maximum height difference of the unevenness over an entirety of the surface of the organic insulating layer. In that case, the organic insulating layer is never exposed, and the unevenness of the surface of the organic insulating layer can be leveled at the surface of the planarizing layer.

(8) A method of manufacturing an organic-EL display apparatus according to second embodiment of the present invention comprises: forming a drive circuit on a substrate, the drive circuit comprising a thin-film transistor; forming, on a surface of the drive circuit, a first inorganic insulating layer, an organic insulating layer, and a second inorganic insulating layer; polishing a surface of the second inorganic insulating layer; forming a contact hole in the second to inorganic insulating layer, the organic insulating layer, and the first inorganic insulating layer, so as to reach the thin-film transistor; embedding a metal at the interior of the contact hole and forming a first electrode at a given region; forming an organic light-emitting layer on the first electrode; and forming a second electrode on the organic light-emitting layer, wherein the thin-film transistor is formed so as to have a deposition structure comprising a gate electrode, a gate insulating layer, a semiconductor layer comprising a region to be a channel, a first conductor layer making up a drain electrode, and a second conductor layer making up a source electrode; the first conductor layer and the second conductor layer are formed such that a part of the first conductor layer and a part of the second conductor layer are alternately lined up along a given direction; and the region to be a channel is sandwiched between the part of the first conductor layer and the part of the second conductor layer.

The configuration according to (8) makes it possible to suitably manufacture an organic-EL display apparatus having a drive circuit being excellent in drive capability and having a small display non-uniformity.

(9) In the method of manufacturing an organic-EL display apparatus according to (8) mentioned above, forming the thin-film transistor can comprise: forming, on the substrate, the gate electrode extending along the given direction; forming the gate insulating layer on the gate electrode; forming, on the gate insulating layer, the semiconductor layer made of amorphous silicon and extending along the given direction, so as to cover the gate electrode; and forming the first conductor layer comprising a plurality of first portions extending to along a direction crossing the given direction and the second conductor layer comprising a plurality of second portions extending along a direction crossing the given direction such that the each first portion and each second portion are alternately arranged along the given direction. This makes it possible to form a TFT having a bottom gate structure (reverse-staggered structure).

(10) In the method of manufacturing an organic-EL display apparatus according to (8) mentioned above, forming the thin-film transistor can comprise: forming, on the substrate, the first conductor layer comprising a plurality of first portions extending along a direction crossing the given direction and the second conductor layer comprising a plurality of second portions extending along a direction crossing the given direction such that each first portion and each second portion are alternately arranged along the given direction; forming the semiconductor layer made of amorphous silicon and extending along the given direction, on the first conductor layer and the second conductor layer; forming the gate insulating layer on the semiconductor layer; and forming, on the gate insulating layer, the gate electrode extending along the given direction, so as to cover a portion at which each first portion and each second portion face each other. This makes it possible to form a TFT of a top gate structure (staggered structure).

(11) In the method of manufacturing an organic-EL display apparatus according to any one of (8) to (10) mentioned above, each of the first conductor layer and the second conductor layer can be formed so as to have a comb shape and can be formed such that a comb tooth portion of the first conductor layer and a comb tooth portion of the second conductor layer engage with each other. In this way, a large number of facing portions of the part of the first conductor layer and the part of the second conductor layer can be formed efficiently.

(12) In the method of manufacturing an organic-EL display apparatus according to any one of (8) to (11) mentioned above, a second semiconductor layer having a high impurity concentration can be interposed between the semiconductor layer and each of the first conductor layer and the second conductor layer. This makes it possible to reduce the contact resistance between the semiconductor layer and each of the drain electrode and the source electrode.

(13) In the method of manufacturing an organic-EL display apparatus according to (8) to (12) mentioned above, in forming of the second inorganic insulating layer, the second inorganic insulating layer can be formed so as to have a thickness of equal to or more than twice a maximum height difference of an unevenness of a surface of the organic insulating layer; and, in polishing of the surface of the second inorganic insulating layer, the second inorganic insulating layer can be polished such that an amount of decrease in a thickness of the second inorganic insulating layer due to the polishing reaches, at least partially, an amount equal to or more than one times the maximum height difference and less than two times the maximum height difference. In this way, the unevenness that can appear on the surface of the second inorganic insulating layer after formation thereof based on the unevenness of the organic insulating layer can surely be leveled, and, even more, exposure of the organic insulating layer due to the polishing can almost surely be prevented.

DESCRIPTION OF REFERENCE NUMERALS

1 Organic-EL display apparatus
2 Drive circuit
3 Organic-EL display panel
10 Substrate
20 Thin-film transistor (driving TFT, TFT)
21 Semiconductor layer
21c Region to be a channel
22 Gate insulating layer
23 Gate electrode
25 Source electrode
25a Second conductor layer
25a1 to 25a6 Second portions (comb tooth portions)
26 Drain electrode
26a First conductor layer
26a1 to 26a6 First portions (comb tooth portions)
30 Planarizing layer
30a, 30b Contact hole
31 First inorganic insulating layer
32 Organic insulating layer
33 Second inorganic insulating layer
40 Organic light-emitting element (OLED)
41 First electrode
43 Organic light-emitting layer
44 Second electrode

The invention claimed is:
1. An organic-EL display apparatus, comprising:
a substrate having a surface with a drive circuit formed on the surface, the drive circuit comprising a thin-film transistor;
a planarizing layer to planarize the surface of the substrate by covering the drive circuit; and
an organic light-emitting element being formed on a surface of the planarizing layer facing to an opposite orientation from the drive circuit, and electrically connected to the drive circuit, wherein
the surface of the planarizing layer has an arithmetic average roughness of 50 nm or less;
the thin-film transistor comprises a gate electrode, a drain electrode, a source electrode, and a semiconductor layer comprising a region to be a channel of the thin-film transistor and partially overlapping with the drain electrode and the source electrode;
a part of a first conductor layer making up the drain electrode and a part of a second conductor layer making up the source electrode are alternately lined up along a given direction;
the region to be the channel is sandwiched between the part of the first conductor layer and the part of the second conductor layer;
the planarizing layer comprises a first inorganic insulating layer being deposited on the drive circuit, an organic insulating layer being deposited on the first inorganic insulating layer, and a second inorganic insulating layer being deposited on the organic insulating layer; and a surface of the second inorganic insulating layer facing to an opposite orientation from the organic insulating layer has a surface roughness of 20 nm or more and 50 nm or less.

2. The organic-EL display apparatus according to claim 1, wherein
the semiconductor layer comprises a plurality of regions, each one of the plurality of regions being the region to be the channel being sandwiched between the part of the first conductor layer and the part of the second conductor layer,
the semiconductor layer is made of amorphous silicon, and
W/L is 50 or more and 500 or less, wherein the W denotes a sum of lengths of facing portions in the plurality of regions, each of the facing portions being a portion at which the part of the first conductor layer and the part of the second conductor layer face each other, and the L denotes an interval between the first conductor layer and the second conductor layer at the facing portions.

3. The organic-EL display apparatus according to claim 1, wherein each of the first conductor layer and the second conductor layer is formed into a comb shape in planar view and is formed such that a comb tooth portion of the first conductor layer and a comb tooth portion of the second conductor layer engage with each other.

4. The organic-EL display apparatus according to claim 1, wherein
a light-emitting region of the organic light-emitting element is formed in a rectangular shape,
the thin-film transistor is formed at an underlayer of the light-emitting region,
the part of the first conductor layer and the part of the second conductor layer extend along a long side of the rectangular shape,
a length of the part of the first conductor layer which extends along the long side is greater than a length of a connection portion connecting a plurality of the parts of the first conductor layer, and
a length of the part of the second conductor layer which extends along the long side is greater than a length of a connection portion connecting a plurality of the parts of the second conductor layer.

5. The organic-EL display apparatus according to claim 1, wherein the gate electrode is formed over an entire range of a length of a portion at which the part of the first conductor layer and the part of the second conductor layer face each other.

6. The organic-EL display apparatus according to claim 1, wherein
a thickness of the second inorganic insulating layer varies based on an unevenness of a surface of the organic insulating layer facing to the second inorganic insulating layer,
the thickness of the second inorganic insulating layer is equal to or more than one times a maximum height difference of the unevenness and equal to or less than three times the maximum height difference of the unevenness over an entirety of the surface of the organic insulating layer,
a maximum thickness of the second inorganic insulating layer is equal to or more than two times the maximum height difference of the unevenness and equal to or less than three times the maximum height difference of the unevenness, and
a minimum thickness of the second inorganic insulating layer is equal to or more than one times the maximum height difference of the unevenness and equal to or less than two times the maximum height difference of the unevenness.

7. The organic-EL display apparatus according to claim 1, wherein the thin-film transistor is formed at an underlayer of a light-emitting region of the organic light-emitting element, so as to overlap with an entirety of the light-emitting region.

8. The organic-EL display apparatus according to claim 1, wherein
plural parts each being the part of one of the first conductor layer and the second conductor layer are coupled at respective end portions, thereby the one of the first conductor layer and the second conductor layer has a zig-zag planer shape;
other one of the first conductor layer and the second conductor layer is formed at surroundings of the one of the first conductor layer and the second conductor layer; and
the part of the other one of the first conductor layer and the second conductor layer is inserted into a concavity of the zig-zag planer shape.

9. The organic-EL display apparatus according to claim 1, wherein the organic insulating layer comprises an additive agent at a content rate of 0.5 mass % or more and 5 mass % or less, wherein the additive agent improves a planarity of a surface of the organic insulating layer facing to the second inorganic insulating layer.

* * * * *